United States Patent [19]
Onishi

[11] Patent Number: 5,650,260
[45] Date of Patent: Jul. 22, 1997

[54] METHOD AND APPARATUS FOR FABRICATING THREE-DIMENSIONAL OBJECT

[75] Inventor: Hisatomo Onishi, Tokyo, Japan

[73] Assignee: Teijin Seiki Co., Ltd., Osaka, Japan

[21] Appl. No.: 286,647

[22] Filed: Aug. 5, 1994

[30] Foreign Application Priority Data

Oct. 14, 1993 [JP] Japan ................... 5-256205

[51] Int. Cl.⁶ ..................... G03F 7/34; B29C 35/08
[52] U.S. Cl. ............. 430/269; 430/320; 425/174.4; 264/401
[58] Field of Search ............... 430/269, 320; 425/174.4; 264/401

[56] References Cited

U.S. PATENT DOCUMENTS

| | | | |
|---|---|---|---|
| 5,051,334 | 9/1991 | Fan | 430/269 |
| 5,094,935 | 3/1992 | Vassiliou et al. | 430/320 |
| 5,122,441 | 6/1992 | Lawton et al. | 430/269 |
| 5,175,077 | 12/1992 | Grossa | 425/174.4 |
| 5,192,559 | 3/1993 | Hull et al. | 425/174.4 |

*Primary Examiner*—John S. Chu

[57] ABSTRACT

A three-dimensional object is constituted by successive solid layers each formed by selectively exposing an unexposed layer of a photohardenable composition to actinic radiation. The unexposed layer of the photohardenable composition is formed on the flexible sheet belt. The flexible sheet belt is brought into close and parallel relationship with a flat support surface of a base plate member facing downwardly, thereby laminating the unexposed layer of the photohardenable composition to the flat support surface of the base plate member of the solid layer previously formed. A positioning plate member is positioned in such a manner that the positioning plate member faces the base plate member through the flexible sheet belt and is brought into contact with the flexible sheet belt, so that the unexposed layer of the photohardenable composition is supported and positioned by the positioning plate member through the flexible sheet belt. The laminated unexposed layer of the photohardenable composition is selectively exposed to the actinic radiation through the positioning plate member and the flexible sheet belt to form a new solid layer and an unhardened layer of the photohardenable composition. After the positioning plate member is removed from the flexible sheet belt, the flexible sheet belt with the unhardened layer of the photohardenable composition is separated from the newly formed solid layer.

23 Claims, 12 Drawing Sheets

METHOD AND APPARATUS FOR FABRICATING THREE-DIMENSIONAL OBJECT

FIELD OF THE INVENTION

The present invention relates to a method of and an apparatus for fabricating a three-dimensional object which is constituted by successive solid layers each formed by selectively exposing an unexposed layer of a photohardenable composition to actinic radiation.

DESCRIPTION OF THE PRIOR ART

There have so far been proposed a wide variety of methods of and apparatuses for fabricating integral three-dimensional objects, which are disclosed, for instance, in Japanese Patent Publication Nos. 2-48422 and 5-23588. An apparatus for fabricating a three-dimensional object disclosed in the former publication is shown in FIG. 18 as comprising a first vessel 501 full up with a photohardenable resin 502, a resin feed device 503 for feeding the photohardenable resin 502 to the first vessel 501 to fill the first vessel 501 with the photohardenable resin 502, and a base plate member 504 formed with a flat support surface 504a which faces upwardly and is to have solid layers 505 thereon, the base plate member 504 being held in a parallel relationship with an interface 502a of the photohardenable resin 502. The fabricating apparatus further comprises a second vessel 506 for containing the photohardenable resin 502 overflowing the first vessel 501, an exposure unit 507 such as a laser unit for selectively exposing to actinic radiation 508 a thin layer 502b of the photohardenable resin 502 defined by the interface 502a of the photohardenable resin 502 and the uppermost solid layer 505, the exposure unit 507 being standstill with respect to the first vessel 501, and an elevator unit 509 movable in upward and downward directions each perpendicular to the surface 504a of the photohardenable resin 502 with respect to the exposure unit 507 and the first vessel 501.

In the fabricating apparatus shown in FIG. 18 and thus constructed, firstly, the base plate member 504 is moved by the elevator unit 509 with respect to the exposure unit 507 and the first vessel 501 to form a first thin layer 502b of the photohardenable resin 502 between the flat support surface 504a of the base plate member 504 and the interface 502a of the photohardenable resin 502. The formed first thin layer 502b of the photohardenable resin 502 is selectively exposed to the actinic radiation 508 from the exposure unit 507 to form a first solid layer 505 on the flat support surface 504a of the base plate member 504. Next, the base plate member 504 is moved in the downward direction with respect to the exposure unit 507 and the first vessel 501 by a constant distance substantially equal to the thickness of the solid layer 505, so that an second thin layer 502b of the photohardenable resin 502 is formed on the first solid layer 505. During the formation of the second thin layer 502b of the photohardenable resin 502, the resin feed device 503 continues to feed the photohardenable resin 502 to the first vessel 501 in order to have the photohardenable resin 502 overflowing the first vessel 501. As a result, it is assured that the formed second thin layer 502b of the photohardenable resin 502 has an accurate thickness and is positioned with respect to the exposure unit 507. After the formation of the second thin layer 502b of the photohardenable resin 502, the formed second thin layer 502a of the photohardenable resin 502 is selectively exposed to the actinic radiation 508 from the exposure unit 507 to form a second solid layer 505 on the first solid layer 505. The foregoing steps between the formation of the first solid layer 505 and the formation of the second solid layer 505 are repeated until a three-dimensional object is formed by successive solid layers 505. A method of forming the thin layer 502b of the photohardenable resin 502 can be called a free-interface-method. The reason is that there is no wall or member restricting the interface 502a of the photohardenable resin 502 as will be understood from FIG. 18.

The fabricating apparatus shown in FIG. 18 and thus constructed, however, has drawbacks described hereinafter. It is hard to maintain the overall interface 502a of the photohardenable resin 502 at a constant horizontal level, since the interface 502a of the photohardenable resin 502 is stepped at the edge the uppermost solid layer 505 owing to surface tension of the photohardenable resin 502. Therefore, the fabricating apparatus shown in FIG. 18 has difficulty in accurately controlling the thickness of the formed thin layer 502b of the photohardenable resin 502 defined at its one side by the interface 502a of the photohardenable resin 502. Although the photohardenable resin 502 is generally required to have high viscosity in order to prevent the solid layer 505 from being contracted or distorted in the influence of the actinic radiation 508 from the exposure unit 507, the high viscosity facilitates the fact that the interface 502a of the photohardenable resin 502 is stepped at the edge of the uppermost solid layer 505. That is, the photohardenable resin 502 having the high viscosity cannot be used in the fabricating apparatus shown in FIG. 18 and as a consequence the formed solid layer 505 cannot be prevented from being contracted or distorted.

The three-dimensional object fabricated by the apparatus shown in FIG. 18 is expensive for its size because of the fact that the photohardenable resin 502 is required to overflow the first vessel 501, and accordingly a large amount of photohardenable resin is necessarily used for fabricating a small three-dimensional object.

The exposure unit 507 is required to comprise an expensive laser unit and a micro-computer executing complicated programs to control the expensive laser unit, so that the fabricating apparatus becomes extremely expensive. If, specifically, the thin layer 502b of the photohardenable resin 502 is overexposed to an uncontrollable actinic radiation from the exposure unit 507, and if the solid layer 505 resulting from the overexposed thin layer 502b of the photohardenable resin 502 has an overhang portion, the overhang portion of the solid layer 505 becomes larger in thickness than a desired value. This means that it is necessary to precisely control the actinic radiation. Under the present technologies, the precise radiation control can be obtained only through the combination of the expensive laser unit and the micro-computer executing the complicated programs to control the expensive laser unit. A low-priced and high-powered radiation source such as a mercury-vapor lamp cannot be used in the fabricating apparatus shown in FIG. 18.

The three-dimensional object is fabricated under the condition that the three-dimensional object is soaked in the photohardenable resin 502, and therefore it is necessary to rinse the photohardenable resin 502 out of the fabricated three-dimensional object after the fabricated three-dimensional object is taken out from the first vessel 501. Furthermore, the three-dimensional object is required to be re-exposed to an actinic radiation in a so-called postcuring process after the photohardenable resin 502 is rinsed out of the fabricated three-dimensional object, because of the fact that the thin layer 502b of the photohardenable composition 502 cannot be exposed to a powerful actinic radiation as above-mentioned. Therefore, the overall processes of fabricating the three-dimensional object take a long time.

In the meantime, another fabricating apparatus disclosed in the latter publication is shown in FIG. 19 as comprising a vessel 601 containing a photohardenable resin 602 and including a glass plate member 601a transmissive to actinic radiation 604, and a base plate member 605 formed with aflat support surface 605a which faces downwardly and is to have the solid layers 603 supported thereon, the flat support surface 605a of the base plate member being held in a parallel relationship with the glass plate member 601a of the vessel 601 as well as an interface 602a of the photohardenable resin 602 defined at its one side by the glass plate member 601a of the vessel 601. The fabricating apparatus further comprises an exposure unit 606 for selectively exposing to the actinic radiation 604 a thin layer 602b defined by the glass plate member 601a of the vessel 601 and the lowermost solid layer 603, the exposure unit 606 being standstill with respect to the glass plate member 601a of the vessel 601, and an elevator unit 607 for moving the base plate member 605 in upward and downward directions in a parallel relationship to the glass plate member 601a with respect to the exposure unit 606.

In the fabricating apparatus shown in FIG. 19 and thus constructed, firstly, the base plate member 605 is moved by the elevator unit 607 with respect to the glass plate member 601a of the vessel 601 to form a first thin layer 602b of the photohardenable resin 602 between theflat support surface 605a of the base plate member 605 and the glass plate member 601a of the vessel 601. The formed first thin layer 602b of the photohardenable resin 602 is selectively exposed to the actinic radiation 604 from the exposure unit 606 to form a first solid layer 603 on theflat support surface 605a of the base plate member 605. Next, the base plate member 605 is moved in the upward direction with respect to glass plate member 601a of the vessel 601 by a constant distance larger than the thickness of the solid layer 603, and subsequently moved in the downward direction with respect to the glass plate member 601a of the vessel 601 to the extent that a distance between the base plate member 605 and the glass plate member 601a of the vessel 601 is substantially equal to the thickness of the solid layer 603, thereby causing the photohardenable resin 602 to quickly flow into a gap between the first solid layer 603 and the glass plate member 601a of the vessel 601 to form an second thin layer 602b of the photohardenable resin 602 between the first solid layer 603 and the glass plate member 601a of the vessel 601. At the same time, it is assured that the formed second thin layer 602b of the photohardenable resin 602 has an accurate thickness and is positioned with respect to the exposure unit 606, since the formed second solid layer 602b of the photohardenable resin 602 is defined at its one side by the glass plate member 601a precisely positioned with respect to the exposure unit 606. After the formation of the second thin layer 602b of the photohardenable resin 602, the formed thin layer 602b of the photohardenable resin 602 is selectively exposed to the actinic radiation 604 from the exposure unit 606 to form a second solid layer 603 on the first solid layer 603. The foregoing steps between the formation of the first solid layer 603 and the formation of the second solid layer 603 are repeated until a three-dimensional object is formed by successive solid layers 603. A method of forming the thin layer 602b of the photohardenable resin 602 can be called a restricted-interface-method. The reason is that the interface 602a of the photohardenable resin 602 is restricted by the glass plate member 601a of the vessel 601.

The fabricating apparatus shown in FIG. 19 and thus constructed, however, has drawbacks described hereinlater. The thin layer 602b of the photohardenable resin 602 is defined at one side by the lowermost solid layer 603 or base plate member 605 and at the other side by the glass plate member 601a of the vessel 601, so that it is necessary to separate a formed solid layer 603 from the glass plate member 601a of the vessel 601 in order to form a new thin layer 602b of the photohardenable resin 602. When the formed solid layer 603 is separated from the glass plate member 601a of the vessel 601, the formed solid layer 603 is likely to be damaged and distorted. If the base plate member 605 is slowly moved in the upward direction with respect to the glass plate member 601a of the vessel 601 in order to prevent the formed solid layer 603 from being damaged and distorted, the movement of the base plate member 605 takes a long time.

Similarly to the fabricating apparatus shown in FIG. 18, the exposure unit 606 is required to comprise an expensive laser unit and a micro-computer executing complicated programs to precisely control the expensive laser unit, so that the fabricating apparatus becomes extremely expensive. If the thin layer 602b of the photohardenable resin 602 is overexposed to an uncontrollable actinic radiation from the exposure unit 606, and if the solid layer 603 resulting from the overexposed thin layer 602b of the photohardenable resin 602 has an overhang portion, the overhang portion of the solid layer 603 becomes larger in thickness than a desired value, and as a result it is necessary to precisely control the actinic radiation. Under the present technologies, the precise radiation control can be obtained only through the combination of the expensive laser unit and the micro-computer executing the complicated programs to control the expensive laser unit. A low-priced and high-powered radiation source such as a mercury-vapor lamp cannot be used in the fabricating apparatus shown in FIG. 19. In addition, the three-dimensional object is fabricated under the condition that the three-dimensional object is soaked in the photohardenable resin 602 and accordingly it is necessary to rinse the photohardenable resin 602 out of the fabricated three-dimensional object after the fabricated three-dimensional object is taken out from the vessel 601. Furthermore, the three-dimensional object is required to be re-exposed to an actinic radiation in the postcuring process after the photohardenable resin 602 is rinsed out of the fabricated three-dimensional object. The reason is that the thin layer 602b of the photohardenable composition 602 cannot be exposed to a powerful actinic radiation as above-mentioned. Therefore, the overall processes of fabricating the three-dimensional object take a long time.

The present invention contemplates provision of an method of and an apparatus for fabricating an three-dimensional object, which overcomes the drawbacks of the prior-art fabricating apparatuses described hereinbefore.

SUMMARY OF THE INVENTION

According to one aspect of the present invention there is provided a method of fabricating a three-dimensional object which is constituted by successive solid layers each formed by selectively exposing an unexposed layer of a photohardenable composition to actinic radiation in a layer exposing area, the unexposed layer of the photohardenable composition being formed in a layer forming area and then conveyed to the layer exposing area, and the method comprising the steps of (a) preparing a flexible sheet belt transmissive to the actinic radiation, a base plate member having aflat support surface facing downwardly, and a positioning plate member transmissive to the actinic radiation, (b) forming the unexposed layer of the photohardenable composition on the flexible sheet belt in the layer forming area, (c) moving the flexible sheet belt from the layer forming area toward the layer exposing area to convey the unexposed layer of the photohardenable composition on the flexible sheet belt from the layer forming area to the layer exposing area, (d) bringing the flexible sheet belt into a close and parallel relationship with the flat support surface of the base plate member to laminate the unexposed layer of the photohardenable composition to the flat support surface of the base plate member or the solid layer previously formed, (e) positioning the positioning plate member in such a manner that the positioning plate member faces the base plate member through the flexible sheet belt and be brought into contact with the flexible sheet belt, so that the unexposed layer of the photohardenable composition is supported and positioned by the positioning plate member through the flexible sheet belt, (f) selectively exposing the unexposed layer of the photohardenable composition to the actinic radiation through the positioning plate member and the flexible sheet belt to form a new solid layer and an unhardened layer of the photohardenable composition, (g) removing the positioning plate member from the flexible sheet belt, (h) separating the flexible sheet belt with the unhardened layer of the photohardenable composition from the newly formed solid layer, and (i) repeating the steps (b) to (h) until the three-dimensional object is formed by the solid layers.

According to another aspect of the present invention there is provided an apparatus for fabricating a three-dimensional object which is constituted by successive solid layers each formed by selectively exposing an unexposed layer of a photohardenable composition to actinic radiation in a layer exposing area, the unexposed layer of the photohardenable composition being formed in a layer forming area and then conveyed to the layer exposing area, and the apparatus comprising a flexible sheet belt transmissive to the actinic radiation, layer forming means for forming the unexposed layer of the photohardenable composition on the flexible sheet belt in the layer forming area, a base plate member placed in the layer exposing area and having a flat support surface facing downwardly, moving means for moving the flexible sheet belt from the layer forming area toward the layer exposing area to convey the unexposed layer of the photohardenable composition formed on the flexible sheet belt from the layer forming area to the layer exposing area, layer laminating means for bringing the flexible sheet belt into a close and parallel relationship to the flat support surface of the base plate member to laminate the unexposed layer of the photohardenable composition to the flat support surface of the base plate member or the solid layer previously formed, a positioning plate member movable with respect to the base plate member to assume two different positions consisting of a first plate position in which the unexposed layer of the photohardenable composition is allowed to be laminated by the layer laminating means to the flat support surface of the base plate member or the solid layer previously formed, and a second plate position in which the positioning plate member is positioned so as to face the base plate member through the flexible sheet belt and to be brought into contact with the flexible sheet belt, so that the unexposed layer of the photohardenable composition is supported and positioned by the positioning plate member through the flexible sheet belt, exposure means for selectively exposing the unexposed layer of the photohardenable composition to the actinic radiation through the positioning plate member and the flexible sheet belt to form a new solid layer and an unhardened layer of the photohardenable composition, plate member moving means for moving the positioning plate member to cause the positioning plate member to assume the first plate position before the unexposed layer of the photohardenable composition is laminated by the layer laminating means to the flat support surface of the base plate member or the solid layer previously formed, for further moving the positioning plate member to cause the positioning plate member to assume the second plate position after the unexposed layer of the photohardenable composition is laminated by the layer laminating means to the flat support surface of the base plate member or the solid layer previously formed, before the unexposed layer of the photohardenable composition is selectively exposed by the exposure means to the actinic radiation, and for further moving the positioning plate member so as to return from the second plate position to the first plate position after the unexposed layer of the photohardenable composition is selectively exposed by the exposure means to the actinic radiation, and separating means for separating the flexible sheet belt with the unhardened layer of the photohardenable composition from the solid layer after the positioning plate member is moved by the plate member moving means so as to return from the second plate position to the first plate position.

BRIEF DESCRIPTION OF THE DRAWINGS

The features and advantages of a method of and an apparatus for fabricating a tree-dimensional object in accordance with the present invention will be more clearly understood from the following description taken in conjunction with the accompanying drawings in which.

DESCRIPTION OF THE PREFERRED EMBODIMENTS

Figure 14:
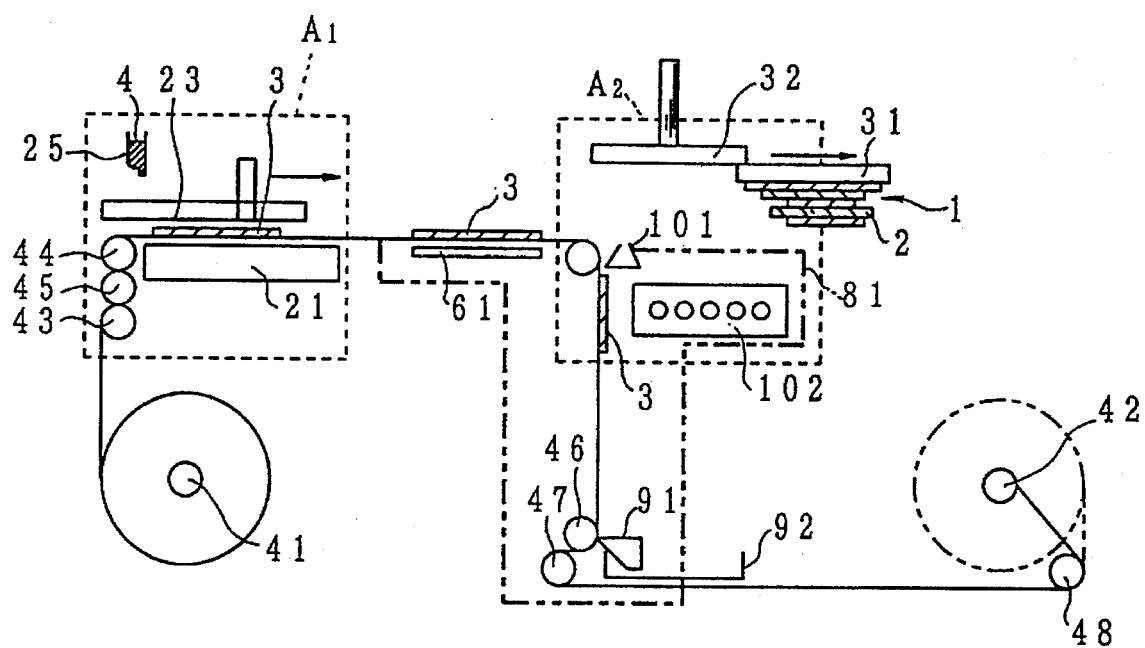
FIG. 14 is a schematic view representative of a step of detaching the base plate member with a three-dimensional object from a base plate member support unit after the three-dimensional object is formed by solid layers.

Referring to FIGS. 1 to 3 and 14 of the drawings, a preferred first embodiment of a fabricating apparatus according to the present invention will be described hereinafter. In FIG. 14, reference numeral 1 denotes a three-dimensional object which is constituted by successive solid layers 2 each formed by selectively exposing, to actinic radiation described hereinafter, an unexposed layer 3 of a photohardenable composition 4 having a thickness, for instance, of 100 to 300 μm in a layer exposing area A2, the unexposed layer 3 of the photohardenable composition 4 being formed in a layer forming area A1 and then conveyed to the layer exposing area A2.

Figure 1:
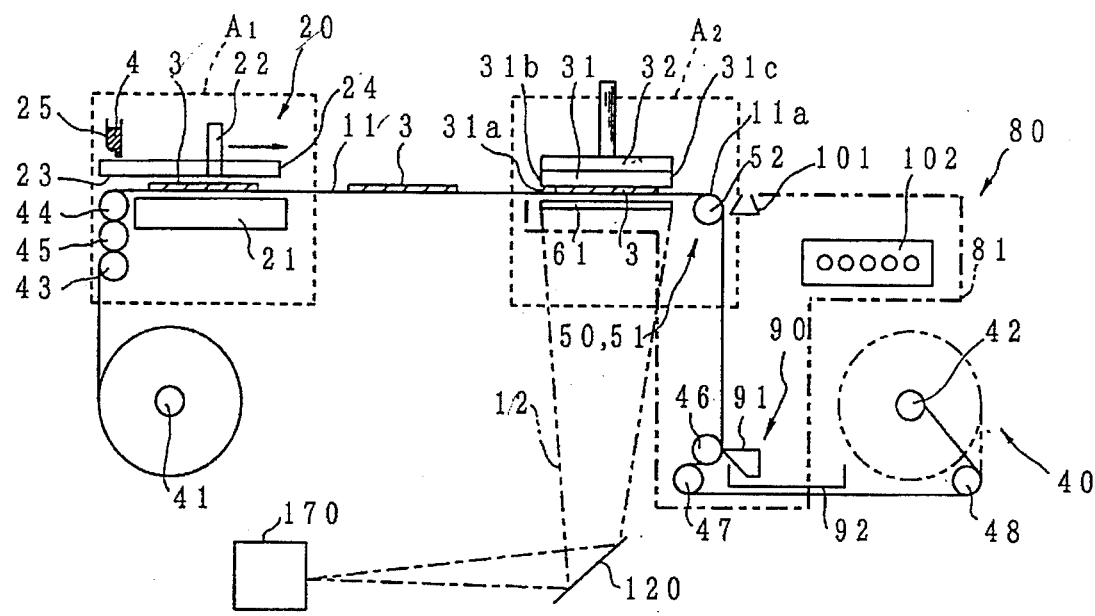
FIG. 1 is a schematic view showing a first embodiment of a fabricating apparatus according to the present invention and representing arrangement of the fabricating apparatus when a positioning plate member and a moving roller assume a second plate position and a second roller position, respectively.
Figure 2:
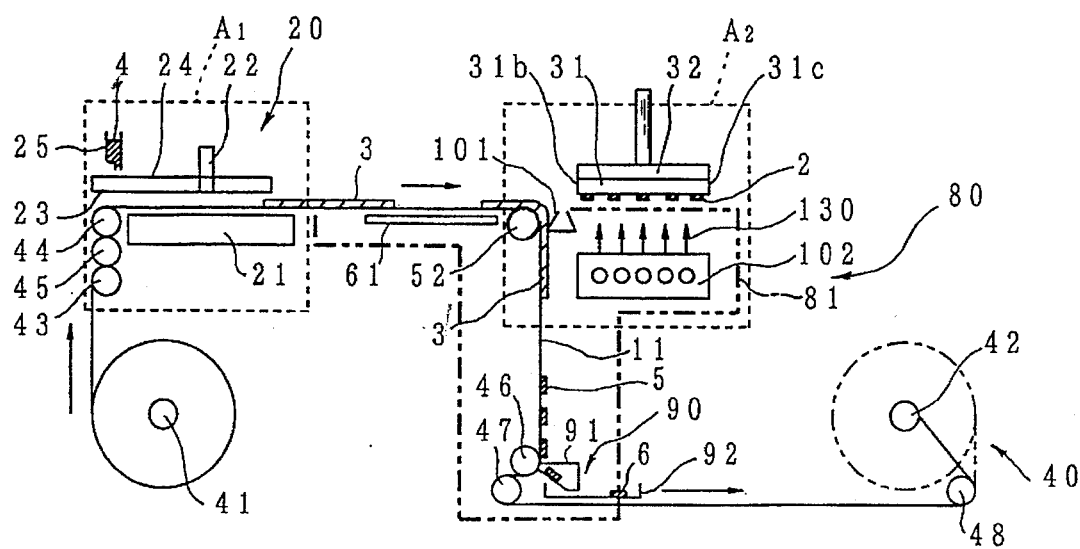
FIG. 2 is a schematic view representing the arrangement of the fabricating apparatus shown in FIG. 1 when the positioning plate member and the moving roller assume a first plate position and a first roller position, respectively.

The fabricating apparatus is shown in FIGS. 1 and 2 as comprising a flexible sheet belt 11 which is transmissive to the actinic radiation 12 and made, for example, of polyester film having a thickness of 20 to 50 μm, and is designed to hardly stretch when a tension smaller than a predetermined level is applied to the flexible sheet belt 11. In addition, the flexible sheet belt 11 is so surface-treated as to be adherent to the photohardenable composition 4 and to be readily separated from the solid layer 2 formed by exposing the unexposed layer 3 of the photohardenable composition 4.

Figure 3:
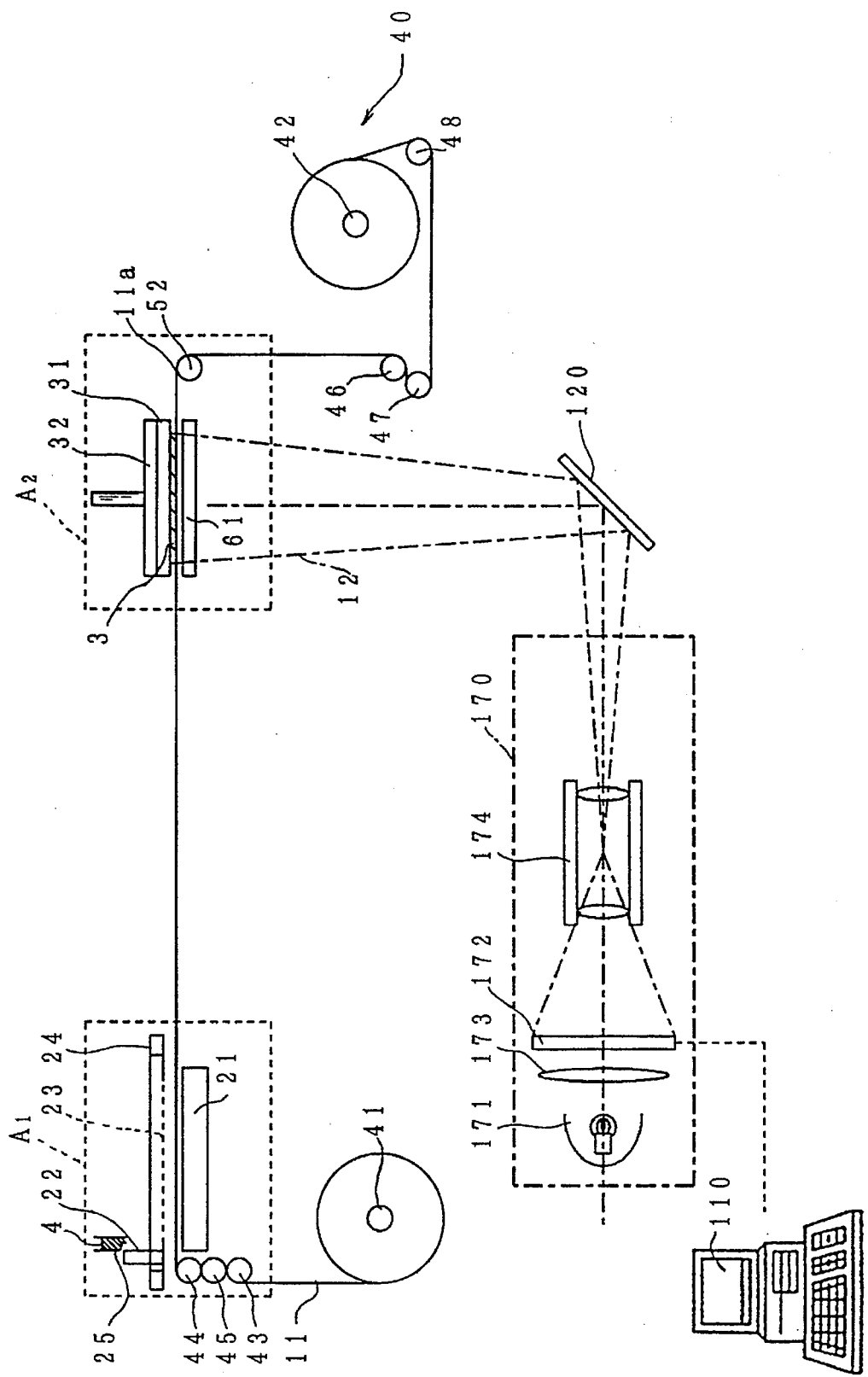
FIG. 3 is a partly enlarged schematic view of the fabricating apparatus shown in FIG. 1.

The fabricating apparatus further comprises layer forming means 20 for forming the unexposed layer 3 of the photohardenable composition 4 on the flexible sheet belt 11 in the layer forming area A1. The forming means 20 is shown in FIGS. 1 to 3 as comprising a flat plate member 21 for having the flexible sheet belt 11 clinging thereto when the unexposed layer 3 of the photohardenable composition 4 is formed on the flexible sheet belt 11 in the layer forming area A1, a squeegee member 22 made of polyurethane rubber and movable over and with respect to the flat plate member in a spaced-apart relationship with the flexible sheet belt 11 on the flat plate member 21 at a constant distance substantially equal to the thickness of the unexposed layer 3 of the photohardenable composition 4. The flat plate member 21 is formed with a plurality of suction bores (not shown) for sucking air between the flat plate member 21 and the flexible sheet belt 11 to cause the flexible sheet belt 11 to cling to the flat plate member 21. More specifically, the fabricating apparatus further comprises a suction pump (not shown) formed with a suction port which is held in communication with the suction bores of the flat plate member 21. When the unexposed layer 3 of the photohardenable composition 4 is formed on the flexible sheet belt 11 in the layer forming area A1, the air between the flat plate member 21 and the flexible sheet belt 11 is sucked by the suction pump through the suction bores of the flat plate member 21, thereby causing the flexible sheet belt 11 to cling to the flat plate member 21. When the formed unexposed layer 3 of the photohardenable composition 4 on the flexible sheet belt 11 is conveyed from the layer forming area A1 toward the layer exposing area A2, the suction by the suction pump is stopped in order to ensure the movement of the flexible sheet belt 11.

The layer forming means 20 further comprises a screen mesh 23 made, for example, of stainless steel and disposed between the flexible sheet belt 11 and the squeegee member 22 in a face-to-face relationship to the flexible sheet belt 11 on the flat plate member 21. The screen mesh 23 is spaced apart from the flexible sheet belt 11 on the flat plate member 21 and capable of having the photohardenable composition 4 placed thereon. The layer forming means 20 further comprises a tenter frame member 24 for supporting the screen mesh 23 to apply a predetermined tension to the screen mesh 23, and a composition feed device 25 for feeding the photohardenable composition 4 to the screen mesh 23 to place the fed photohardenable composition 4 on the screen mesh 23. The screen mesh 23 is designed to permit the photohardenable composition 4 on the screen mesh 23 to pass through the screen mesh 23 to form the unexposed layer 3 of, the photohardenable composition 4 when the squeegee member 22 is moved from one end of the flat plate member 21 toward the other end of the flat plate member 21 in a parallel relationship to the flat plate member 21 with respect to the screen mesh 23 having the photohardenable composition 4 placed thereon. The screen mesh 23 may have a circumferential portion which is covered by a resin layer having a predetermined mask pattern to prohibit the photohardenable composition 4 from passing therethrough. In this case, the photohardenable composition 4 can be saved by varying the size and the shape of the mask pattern in accordance with those of the solid layer 2.

The squeegee member 22, the screen mesh 23 and the tenter frame member 24 are moved by an elevator unit (not shown) in upward and downward directions opposite to each other and perpendicular to the upper surface of the flat plate member 21 to assume two different positions consisting of a downward position in which the unexposed layer 3 of the photohardenable composition 4 is formed on the flexible sheet belt 11 clinging to the flat plate member 21, and an upward position in which the flexible sheet belt 11 is permitted to be moved by moving means 40 which will become apparent as the description proceeds, so that the unexposed layer 3 of the photohardenable composition 4 formed on the flexible sheet belt 11 is conveyed from the layer forming area A1 toward the layer exposing area A2.

When the squeegee member 22, the screen mesh 23 and the tenter frame member 24 are moved by the elevator unit to assume the downward position, the screen mesh 23 is spaced apart from the flexible sheet belt 11 clinging to the flat plate member 21 at a constant distance slightly larger than the thickness of the unexposed layer 3 of the photohardenable composition 4. Under this condition, the squeegee member 22 is moved from one end of the flat plate member 21 toward the other end of the flat plate member 21 over and with respect to the flat plate member 21 in a spaced-apart relationship with the flexible sheet belt 11 clinging to the flat plate member 21 at a constant distance substantially equal to the thickness of the unexposed layer 3 of the photohardenable composition 4, thereby forcing the photohardenable composition 4 to pass through the screen mesh 23 to form the exposed layer 3 of the photohardenable composition 4 on the flexible sheet belt 11. When the flexible sheet belt 11 is free from the flat plate member 21 by stopping the suction of the air between the flat plate member 21 and the flexible sheet belt 11, the squeegee member 22, the screen mesh 23 and the tenter frame member 24 are moved by the elevator unit to assume the upward position and accordingly the screen mesh 23 is spaced apart from the flat plate member 21 to the extent that the flexible sheet belt 11 is not brought into contact with screen mesh 23. As a consequence, the formed unexposed layer 3 of the photohardenable composition 4 is prevented from being damaged and distorted by the screen mesh 23.

The fabricating apparatus further comprises a base plate member 31 placed in the layer exposing area A2 and having a flat support surface 31a which faces downwardly and is to have the solid layers 2 supported thereon, and a plate member support unit 32 detachably supporting the base plate member 31 and moving with respect to exposure means 170 described hereinafter in such a manner that the base plate member 31 is moved from an initial position, in which a first solid layer 2 is formed in the layer exposing area A2, in an upward direction perpendicular to the flat support surface 31a of the base plate member 31 by a distance substantially equal to the thickness of the solid layer 2 each time the solid layer 2 is formed. If the three-dimensional object 1 is fabricated, the base plate member 31 with the three-dimensional object 1 is detached from the plate member support unit 32 as shown in FIG. 14, and as a result the three-dimensional object 1 can be readily obtained without damage and distortion.

The photohardenable composition 4 has a viscosity of 10,000 to 100,000 cP so that the thickness of the unexposed layer 3 of the photohardenable composition 4 can be maintained at a constant level even when the unexposed layer 3 of the photohardenable composition 4 is supported on the flexible sheet belt 11 extending in a vertical direction. In this embodiment, the photohardenable composition comprises a mixture of a photohardenable resin and a plurality of solid particles such as small glass balls transmissive to the actinic radiation 12 without contraction. For example, the solid particles have diameters of 10 to 30 μm and are present in 40 to 75% by volume based on the total volume of the photohardenable composition 4.

The fabricating apparatus further comprises moving means 40 for moving the flexible sheet belt 11 from the layer forming area A1 toward the layer exposing area A2 to convey the unexposed layer 3 of the photohardenable composition 4 formed on the flexible sheet belt 11 from the layer forming area A1 to the layer exposing area A2. The moving means 40 comprises a feed bobbin 41 for previously having the flexible sheet belt 11 wound thereon to feed the flexible sheet belt 11 to the layer forming means 20 in the layer forming area A1 and a winding bobbin 42 for having the fed flexible sheet 11 wound thereon. The feed bobbin 41 is detachably supported by a first bobbin holder (not shown) which applies a constant rotational load to the feed bobbin 41 whenever the flexible sheet belt 11 is unwound from the feed bobbin 41. On the other hand, the winding bobbin 42 is detachably supported by a second bobbin holder (not shown) and is rotated by the rotating means (not shown) which provides the winding bobbin 42 with torque varied with the roll diameter of the flexible sheet belt 11 on the winding bobbin 42. This results in the fact that the tension applied to the flexible sheet belt 11 between the feed bobbin 41 and the winding bobbin 42 is maintained at a constant level even if the roll diameter of the flexible sheet belt 11 on the feed bobbin 41 and the roll diameter of the flexible sheet belt 11 on the winding bobbin 42 are varied with the movement of the flexible sheet belt 11 from the feed bobbin 41 to the winding bobbin 42.

The moving means 40 further comprises driven rollers 43 and 44, a drive roller 45, and rotatable rollers 46, 47 and 48 disposed between the feed bobbin 41 and the winding bobbin 42. The driven roller 43, the drive roller 45 and the driven roller 44 are arranged in a line extending vertically in order of mention in such a manner that the drive roller 45 is positioned between the driven rollers 43 and 44 and held in contact with the driven rollers 43 and 44 through the flexible sheet belt 11. The drive roller 45 is adapted to rotate in a counterclockwise direction in FIG. 1 and accordingly the driven rollers 43 and 44 are rotated by the drive roller 45 through the flexible sheet belt 11 in a clockwise direction in FIG. 1. When the drive roller 44 rotates, the flexible sheet belt 11 is unwounded by the driven rollers 43 and 44 and the drive roller 45 and hoisted on to the flat plate member 21. The rotatable rollers 46 and 47 are rotatably supported by a moving support unit 81 described hereinafter in close relationship to each other, while rotatable roller 48 is disposed between the rotatable roller 47 and the winding bobbin 42. The flexible sheet belt 11 is conveyed by the driven rollers 43 and 44 and the drive roller 45 from the layer forming area A1 to the layer exposing area A2 and further conveyed by the rotatable rollers 46, 47 and 48 from the layer exposing area A2 to the winding bobbin 42.

The fabricating apparatus further comprises layer laminating means 50 for bringing the flexible sheet belt 11 into a close and parallel relationship to the flat support surface 31a of the base plate member 31 to laminate the unexposed layer 3 of the photohardenable composition 4 to the flat support surface 31a of the base plate member 31 or the solid layer 3 previously formed and supported on the flat support surface 31a of the base plate member 31. The layer laminating means 50 comprises a moving roller 52 rotatable about its own axis and movable with respect to the base plate member 31 to assume two different positions consisting of first and second roller positions. The arrangement of the fabricating apparatus is shown in FIG. 2 and FIG. 1 when the moving roller 52 assumes the first roller position and the second roller position, respectively. When the moving roller 52 assumes the first roller position, the unexposed layer 3 of the photohardenable composition 4 is allowed to be conveyed by the driven rollers 43 and 44, the drive roller 45, rotatable rollers 46, 47 and 48 and the winding bobbin 42 of the moving means 40 from the layer forming area A1 to the layer exposing area A2 as shown in FIG. 2. When the moving roller 52 assumes the second roller position, the unexposed layer 3 of the photohardenable composition 4 is allowed to be exposed by the exposure means 170 to the actinic radiation 12 through a positioning plate member 61 described hereinafter and the flexible sheet belt 11 as shown in FIG. 1.

The flexible sheet belt 11 is partly turned by the moving roller 52 in the vicinity of one end 31b of the base plate member 31 to have the flexible sheet belt 11 formed with a turned portion 11a when the moving roller 52 is moved to assume the first roller position. When the position of the turned portion 11a of the flexible sheet belt 11 formed by the moving roller 52 is progressively shifted from the one end of the base plate member 31 to the other end of the base plate member 31 by moving the moving roller 52 from the first roller position to the second roller position, the unexposed layer 3 of the photohardenable composition 4 is laminated to the flat support surface 31a of the base plate member 31 or the solid layer 2 previously formed and supported on the flat support surface 31a of the base plate member 31.

Figure 10:
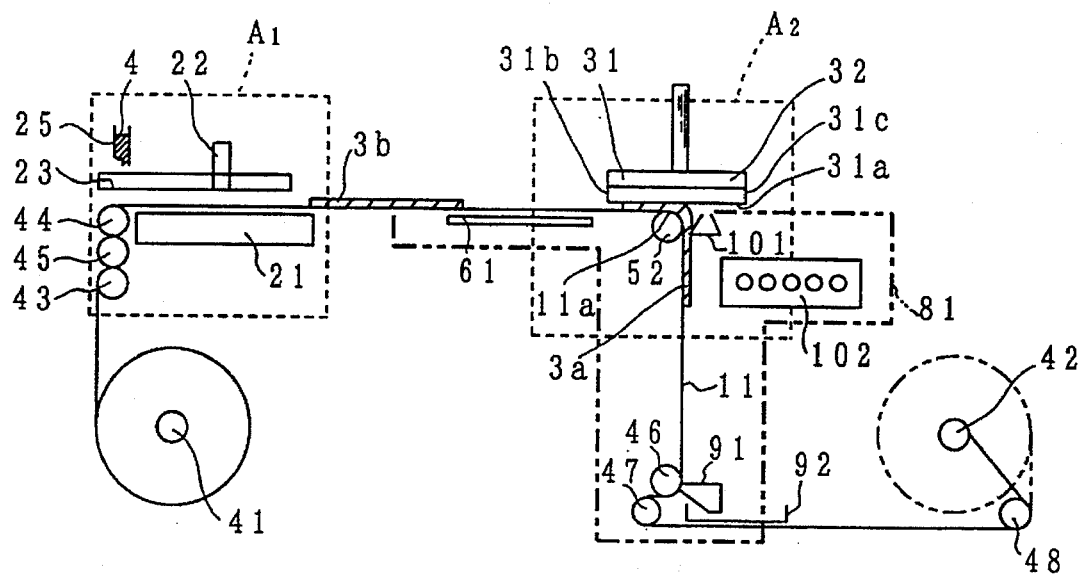
FIG. 10 is a schematic view representative of a step of laminating the first unexposed layer of the photohardenable composition to a flat support surface of a base plate member in the layer exposing area.
Figure 13:
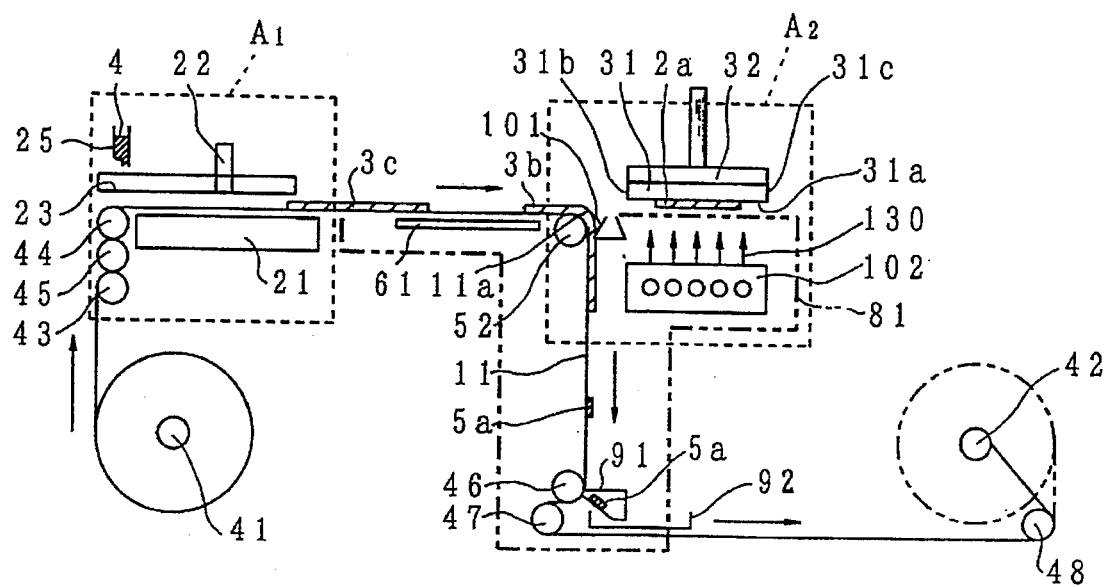
FIG. 13 is a schematic view representative of steps of retrieving the unhardened layer of the photohardenable composition from the flexible sheet belt, and re-exposing the solid layer to another actinic radiation.

The positioning plate member 61 is transmissive to the actinic radiation 12 and made, for instance, of quartz glass. The positioning plate member 61 has upper and lower surfaces parallel to the flat support surface 31a of the base plate member 31. The upper surface of the positioning plate member 61 is smooth and hard enough to be undamaged under the condition that the upper surface of the positioning plate member 61 is held in slidably contact with the flexible sheet belt 11. The lower surface of the positioning plate member 61 is so surface-treated as to permit the actinic radiation 12 to pass therethrough without reflection. The positioning plate member 61 is movable with respect to the base plate member 31 to assume two different positions consisting of first and second plate positions. The arrangement of the fabricating apparatus is shown in FIG. 2 and FIG. 1 when the positioning plate member 61 assumes the first plate position and the second plate position, respectively. When the positioning plate member 61 assumes the first plate position, the unexposed layer 3 of the photohardenable composition 4 is allowed to be laminated by the moving roller 52 of the layer laminating means 50 to the flat support surface 31a of the base plate member 31 or the solid layer 2 previously formed and supported on the flat support surface 31a of the base plate member 31 as shown in FIG. 10. When the positioning plate member 61 assumes the second plate position, the positioning plate member 61 is positioned so as to face the base plate member 31 through the flexible sheet belt 11 in the layer exposing area A2 and to be brought into contact with the flexible sheet belt 11, so that the unexposed layer 3 of the photohardenable composition 4 is supported and positioned by the positioning plate member 61 through the flexible sheet belt 11 against gravity as shown in FIG. 13. Therefore, the positioning plate member 61 is required to be equal to or larger than the largest solid layer 2 in area.

The exposure means 170 is adapted to selectively expose the unexposed layer 3 of the photohardenable composition 4 to the actinic radiation 12 through the positioning plate member 61 and the flexible sheet belt 11 to form a new solid layer 2 and an unhardened layer of the photohardenable composition 4. The unhardened layer of the photohardenable composition 4 is denoted by reference numeral 5 shown in FIG. 2. The construction of the exposure means 170 will become apparent as the description proceeds.

Turning back to FIG. 1, the fabricating apparatus further comprises plate member moving means 80 for moving the positioning plate member 61 to cause the positioning plate member 61 to assume the first plate position before the unexposed layer 3 of the photohardenable composition 4 is laminated by the layer laminating means 50 to the flat support surface 31a of the base plate member 31 or the solid layer 2 previously formed and supported on the flat support surface 31a of the base plate member 31. The plate member moving means 80 is further operative to move the positioning plate member 61 to cause the positioning plate member 61 to assume the second plate position after the unexposed layer 3 of the photohardenable composition 4 is laminated by the layer laminating means 50 to the flat support surface 31a of the base plate member 31 or the solid layer 2 previously formed and supported on the flat support surface 31a of the base plate member 31, before the unexposed layer 3 of the photohardenable composition 4 is selectively exposed by the exposure means 170 to the actinic radiation 12. The plate member moving means 80 is further operative to move the positioning plate member 61 so as to return from the second plate position to the first plate position after the unexposed layer 3 of the photohardenable composition 4 is selectively exposed by the exposure means 170 to the actinic radiation 12.

The fabricating apparatus further comprises separating means 51 for separating the flexible sheet belt 11 with the unhardened layer 5 of the photohardenable composition 4 from the solid layer 2 when the positioning plate member 61 is moved by the plate member moving means 80 to return from the second plate position to the first plate position. The separating means 51 is formed by the moving roller 52 forming the layer laminating means 50. As described above, the flexible sheet belt 11 is partly turned by the moving roller 52 in the vicinity of the one end 31b of the base plate member 31 when the moving roller 52 is moved to assume the first roller position. The position of the turned portion of the flexible sheet belt 11 formed by the moving roller 52 is progressively shifted from the one end 31b of the base plate member 31 to the other end 31c of the base plate member 31 by moving the moving roller 52 from the first roller position to the second roller position, so that the unexposed layer 3 of the photohardenable composition 4 is laminated to the flat support surface 31a of the base plate member 31 or the solid layer 2 previously formed and supported on the flat support surface 31a of the base plate member 31. In the case that the flexible sheet belt 11 with the unhardened layer 5 of the photohardenable composition 4 is separated from the solid layer 2, the position of the turned portion of the flexible sheet belt 11 is progressively shifted from the other end 31c of the base plate member 31 toward one end 31b of the base plate member 31 by moving the moving roller 52 from the second roller position to the first roller position, so that the flexible sheet belt 11 with the unhardened layer 5 of the photohardenable composition 4 is separated from the solid layer 2 as will be best seen from FIG. 12.

The plate member moving means 80 is shown in FIG. 1 as comprising a moving support unit 81 which securely supports the positioning plate member 61 in such a manner that the flexible sheet belt 11 is provided between the positioning plate member 61 and the base plate member 31 when the positioning plate member 61 assumes the second plate position. The moving roller 52 is rotatable supported by the moving support unit 81 and is positioned in such a manner that the positioning plate member 61 follows the moving roller 52 when the positioning plate member 61 and the moving roller 52 are moved to be shifted from the first plate and roller positions to the second plate and roller positions, respectively as shown in FIG. 10. The moving support unit 81 is movable with respect to the base plate member 31 in parallel relationship to the flat support surface 31a of the base plate member 31 to assume two different positions consisting of first and second unit positions. The arrangement of the fabricating apparatus is shown in FIG. 2 and FIG. 1 when the moving support unit 81 assumes the first unit position and the second unit position, respectively. When the moving support unit 81 assumes the first unit position, the positioning plate member 61 and the moving roller 52 assume the first plate position and the first roller position, respectively. When the moving support unit 81 assumes the second unit position, the positioning plate member 61 and the moving roller 52 assume the second plate position and the second roller position, respectively. The rotatable rollers 46 and 47 of the moving means 40 are rotatably supported by moving support unit 81 of the plate member moving means 80, so that the relative position of the moving roller 52 with respect to the rotatable rollers 46 and 47 is invariable when the moving support unit 81 is moved between the first unit position and the second unit position.

The fabricating apparatus further comprises retrieving means 90 for retrieving the unhardened layer 5 of the photohardenable composition 4 from the flexible sheet belt 11 to recycle the unexposed photohardenable composition 6 as will be best seen from FIG. 2. More specifically, the retrieving means 90 comprises a blade member 91 for scraping away the unhardened layer 5 of the photohardenable composition 4 from the flexible sheet belt 11, and a retrieve container 92 for containing the unhardened layer 5 of the photohardenable composition 4 scraped away from the flexible sheet belt 11 by the blade member 91. The blade member 91 and the retrieve container 92 are supported by the moving support unit 81. However, the relative position of the blade member 91 with respect to the rotatable rollers 46 and 47 is variable, since the blade member 91 is moved by drive means (not shown) to assume two different positions consisting of first and second blade positions. when the blade member 91 assumes the first blade position, the blade member 91 is spaced apart from the flexible sheet belt 11 at a constant distance. When the blade member 91 assumes the second blade position, the blade member 91 is brought into contact with the flexible sheet belt 11 and presses upon the rotatable roller 46 through the flexible sheet belt 11. When the unexposed layer 3 of the photohardenable composition 4 is laminated by the moving roller 52 to the flat support surface 31a of the base plate member 31 or the previously formed solid layer 2, the blade member 91 is moved so as to assume the first blade position because of the fact that the flexible sheet belt 11 is moved from rotatable roller 46 toward the moving roller 52 during the laminating operation. As a result, the unhardened layer 5 of the photohardenable composition 4 can be prevented from clinging to the back surface of the blade member 91. The fabricating apparatus may be provided with automatic recycle means for automatically sending the unhardened layer 5 of the photohardenable composition 4 contained in the retrieve container 92 to the composition feed device 25 of the layer forming means 20.

The fabricating apparatus further comprises an aspirator 101 for removing the unhardened layer 5 of the photohardenable composition 4 from the solid layer 2 by suction force after the flexible sheet belt 11 is separated from the solid layer 2. In this embodiment, the aspirator 101 is securely supported by the moving support unit 81 of the plate member moving means 80 and is positioned in such a manner that the aspirator 101 follows the moving roller 52 when the moving roller 52 is moved to return from the second roller position to the first roller position. As a consequence, the unhardened layer 5 of the photohardenable composition 4 can be removed by the aspirator 101 when the moving roller 52 is moved to return from the second roller position to the first roller position. If the unhardened layer 5 of the photohardenable composition 4 is completely removed from the solid layer 2 at the time when the flexible sheet belt 11 is separated from the solid layer 2, it goes without saying that aspirator 101 is unnecessary.

The exposure means 170 is shown in FIG. 3 as comprising a radiation source 171 such as a visible light lamp for radiating the actinic radiation 12, a transmissive type liquid crystal light valve unit 172 provided between the radiation source 171 and the laminated unexposed layer 3 of the photohardenable composition 4 for causing the actinic radiation 12 to selectively pass therethrough and to be transmitted to the laminated unexposed layer 3 of the photohardenable composition 4. The exposure means 170 further comprises a condenser lens 173 provided between the radiation source 171 and the transmissive type liquid crystal light valve unit 172 and an image-formation lens unit 174 provided between the transmissive type liquid crystal light valve unit 172 and the laminated unexposed layer 3 of the photohardenable composition 4. The condenser lens 173 is designed to condense the actinic radiation 12 from the radiation source 171 and concentrate the condensed actinic radiation 12 into the image-formation lens unit 174 through the transmissive type liquid crystal light valve unit 172. Reference numeral 110 denotes an EWS (Engineering Work Station) which is electrically connected to and operates the transmissive type liquid crystal light valve unit 172. Specifically, the transmissive type liquid crystal light valve unit 172 has a lot of pixels each operative alternatively to allow the actinic radiation 12 to pass therethrough and to prevent the actinic radiation 12 from passing therethrough. The pixels of the transmissive type liquid crystal light valve unit 172 are operated by the EWS 110 in accordance with a sectional configuration of the three-dimensional object 1 corresponding to the configuration of the solid layer 2 to form a mask pattern on the transmissive type liquid crystal light valve unit 172, thereby selectively exposing the unexposed layer 3 of the photohardenable composition 4 to the actinic radiation 12 to form the solid layer 2. The exposure means 170 may be provide with zooming unit for zooming in and out on the unexposed layer 3 of the photohardenable composition 4. In this instance, the solid layers having similar figures can be formed without the variation of the mask pattern formed on the transmissive type liquid crystal light valve unit 172.

The fabricating apparatus further comprises a heat absorbing optical element 120 constituted by a heat absorbing type mirror and provided between the radiation source 171 and the laminated unexposed layer 3 of the photohardenable composition 4 in the exposing area A2, preferably between the image-formation lens unit 174 and the laminated unexposed layer 3 of the photohardenable composition 4 as shown in FIG. 3. The heat absorbing optical element 120 is adapted to eliminate infrared radiation included in the actinic radiation 12 from the radiation source 171, thereby controlling temperature rise of the laminated unexposed layer 3 of the photohardenable composition 4 and the formed solid layer 2.

If desired, the fabricating apparatus may further comprise postcuring means 102 for re-exposing the solid layer 2 to an additional actinic radiation 130 after the unhardened layer 5 of the photohardenable composition 4 is removed by the aspirator 101. The postcuring means 102 is fixed to the moving support unit 81 of the plate member moving means 80 and positioned in such a manner that the postcuring means 102 follows the aspirator 101 when the moving support unit 81 is moved to return from the second unit position to the first unit position. The solid layer 2, therefore, is required to be re-exposed to the additional actinic radiation 130 after the moving support unit 81 is returned from the second unit position to the first unit position. In this embodiment, the postcuring means 102 is unnecessary in a general way, since the solid layer 2 is fully hardened on the influence of exposure of the exposure means 170.

The operation of the fabricating apparatus thus constructed will be described hereinafter with reference to FIGS. 4 to 14.

Figure 4:
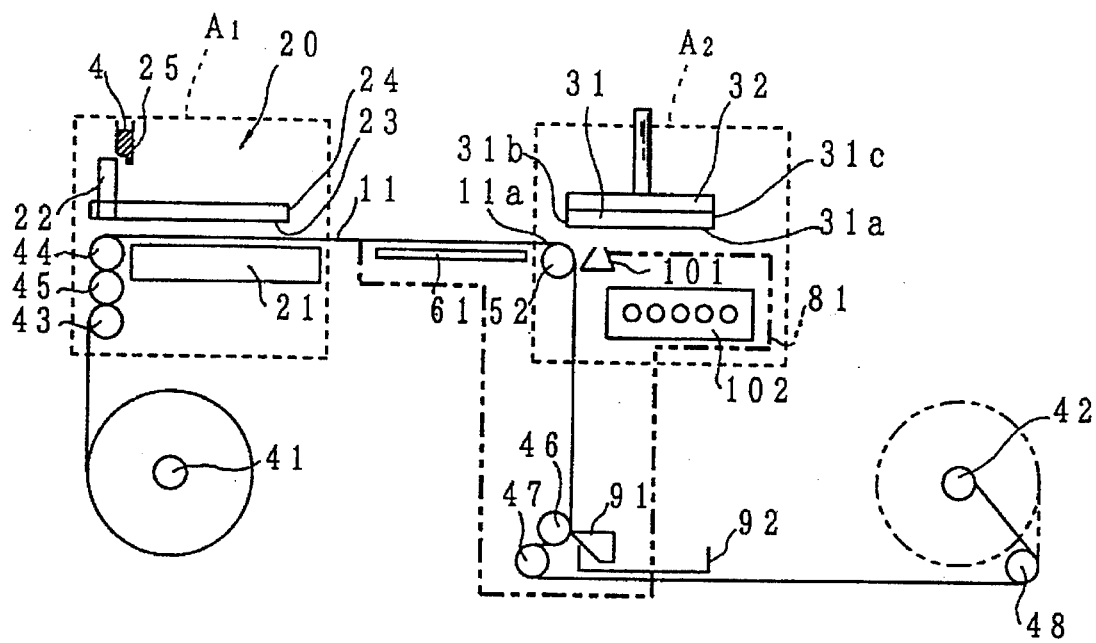
FIG. 4 is a schematic view representative of an initial condition of the fabricating apparatus shown in FIG. 1 before the apparatus is operated.

Referring to FIG. 4, firstly, the moving support unit 81 is moved to assume the first unit position and accordingly the moving roller 52 and the positioning plate member 61 supported by the moving support unit 81 is moved to assume the first roller position and the first plate position, respectively. When the flexible sheet belt 11 is unwound from the feed bobbin 41, the unwounded one end of the flexible sheet belt 11 is transmitted to the winding bobbin 42 through the driven roller 43, the drive roller 45, the driven roller 44, the flat plate member 21, the positioning plate member 61, the moving roller 52, the rotatable rollers 46, 47 and 48 in order of mention, and finally wound on the winding bobbin 42. At the same time, the predetermined tension is applied to the flexible sheet belt 11 between the feed bobbin 41 and winding bobbin 42. Next, the photohardenable composition 4 is fed from the composition feed device 25 to the layer forming means 20 so as to be placed on the screen mesh 23 of the composition feed device 25. The base plate member 31 is attached to and moved by the plate member support unit 32 so as to be precisely positioned with respect to the exposure means 170. The pixels of the transmissive type liquid crystal light valve unit 172 are operated by the EWS 110 to have, on the transmissive type liquid crystal right valve unit 172, a mask pattern corresponding to a first solid layer of the three-dimensional object 1.

Figure 5:
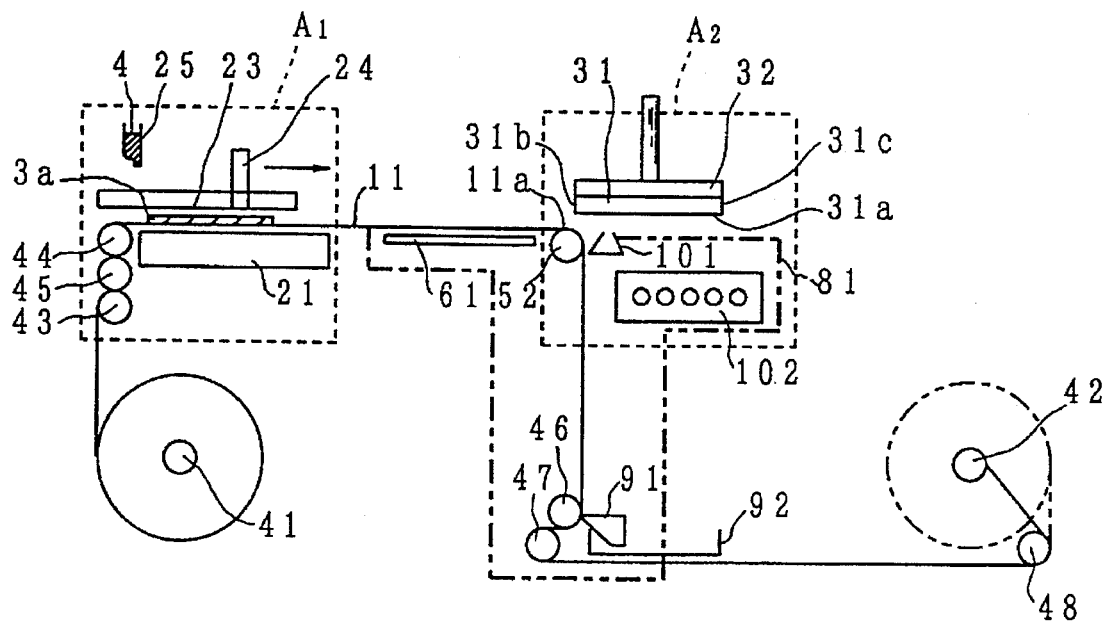
FIG. 5 is a schematic view representative of a step of forming a first unexposed layer of a photohardenable composition on a flexible sheet belt in a layer forming area.

Referring to FIG. 5, the air between the flat plate member 21 and the flexible sheet belt 11 is sucked by the suction pump through the suction bores of the flat plate member 21, so that the flexible sheet belt 11 is forced to cling to the flat plate member 21. This results in the fact that the flexible sheet belt 11 is accurately positioned with respect to theflat plate member 21 without creases, since the flexible sheet belt 11 between the feed bobbin 41 and the winding bobbin 42 has a predetermined tension applied thereto. The squeegee member 22, the screen mesh 23 and the tenter frame member 24 of the layer forming means 20 are moved by the elevator unit in the downward direction so as to be positioned with respect to the flat plate member 21. When the squeegee member 22 is moved from one end of the screen mesh 23 toward the other end of the screen mesh 23 in spaced-apart relationship to the flat plate member 21 at the constant distance substantially equal to the thickness of the solid layer 2, thereby forcing the photohardenable composition 4 on the screen mesh 23 to pass through the screen mesh 23 to form a first unexposed layer 3a of the photohardenable composition 4 on the flexible sheet belt 11 clinging to theflat plate member 21. Although the screen mesh 23 is partly and provisionally brought into contact with the formed first unexposed layer 3a of the photohardenable composition 4, the screen mesh 23 is automatically and readily separated from the formed first unexposed layer 3a of the photohardenable composition 4 by the tension applied by the tenter frame member 24 to the screen mesh 23. As a result, the formed first unexposed layer 3a of the photohardenable composition 4 is prevented from being damaged and distorted by the separation of the screen mesh 23 from the formed first unexposed layer 3a of the photohardenable composition 4. After the first unexposed layer 3a of the photohardenable composition 4 is formed on the flexible sheet belt 11, the flexible sheet belt 11 is free from theflat plate member 21 by stopping the suction of the air between theflat plate member 21 and the flexible sheet belt 11, and then the screen mesh 23 is moved by the elevator unit to return from the downward position to the upward position and accordingly the screen mesh 23 is spaced apart from the flat plate member 21 to the extent that the flexible sheet belt 11 is not brought into contact with screen mesh 23.

Figure 6:
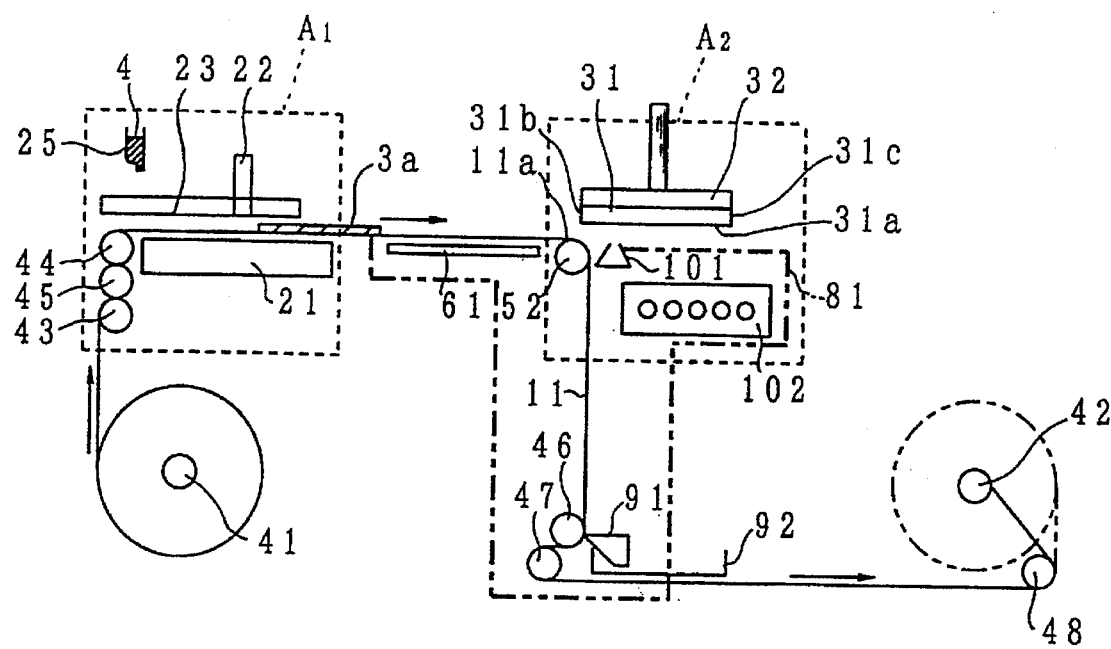
FIG. 6 is a schematic view representative of a step of conveying the first unexposed layer of the photohardenable composition from the layer forming area toward a layer exposure area by moving the flexible sheet belt.

Referring to FIG. 6, the drive roller 45 and the winding bobbin 42 are driven so as to rotate in connection with each other, so that the flexible sheet belt 11 is moved from the layer forming area A1 toward the layer exposing area A2 by a predetermined distance. During the movement of the flexible sheet belt 11, not only the flexible sheet belt 11 is smoothly moved, but also the first unexposed layer 3a of the photohardenable composition 4 is prevented from being damaged and distorted, since the flexible sheet belt 11 and the first unexposed layer 3a of the photohardenable composition 4 are spaced apart from the screen mesh 23 and the flat plate member 21, respectively.

Figure 7:
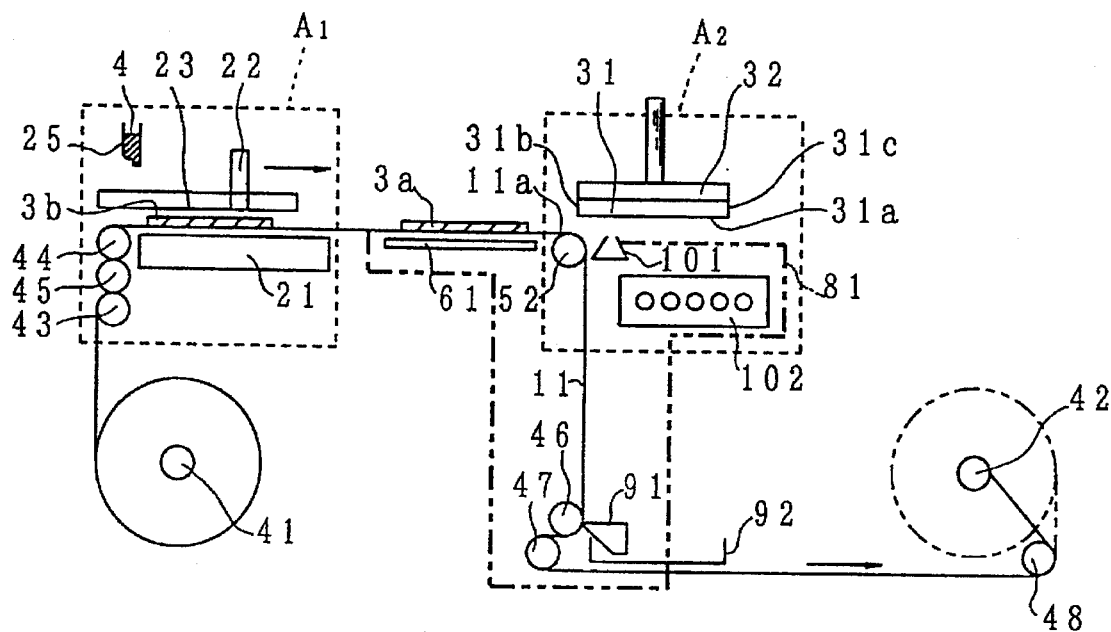
FIG. 7 is a schematic view representative of a step of forming a second unexposed layer of the photohardenable composition on the flexible sheet belt in the layer forming area.

Referring to FIG. 7, similarly to the aforesaid process, the photohardenable composition 4 is fed from the composition feed device 25 to the layer forming means 20 and placed on the screen mesh 23. The air between the flat plate member 21 and the flexible sheet belt 11 is sucked by the suction pump through the suction bores of the flat plate member 21, thereby to cause the flexible sheet belt 11 to cling to the flat plate member 21. After the squeegee member 22, the screen mesh 23 and the tenter frame member 24 of the layer forming means 20 are moved by the elevator unit in the downward direction so as to be positioned with respect to the flat plate member 21, the squeegee member 22 is moved from one end of the screen mesh 23 toward the other end of the screen mesh 23 in a spaced-apart relationship to the flat plate member 21 at the constant distance substantially equal to the thickness of the solid layer thereby forcing the photohardenable composition 4 on the screen mesh 23 to pass through the screen mesh 28 to form a second unexposed layer 8b of the photohardenable composition 4 on the flexible sheet belt 11 clinging to theflat plate member 21. After the second unexposed layer 8b of the photohardenable composition 4 is formed on the flexible sheet belt 11, the flexible sheet belt 11 is free from theflat plate member 21 by stopping the suction of the air between theflat plate member 21 and the flexible sheet belt 11, and then the screen mesh 28 is moved by the elevator unit to return from the screen mesh 28 is spaced apart from theflat plate member 21 to the extent that the flexible sheet belt 11 is not brought into contact with screen mesh 23.

Figure 8:
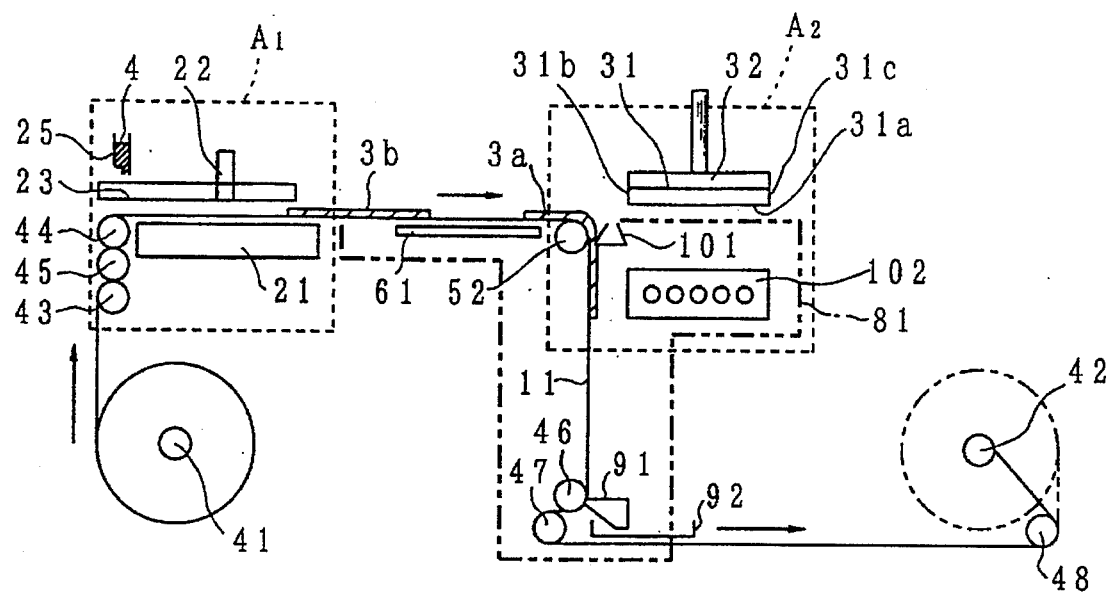
FIG. 8 is a schematic view representative of a step of conveying the first and second unexposed layers of the photohardenable composition toward the layer exposing area by moving the flexible sheet belt.
Figure 9:
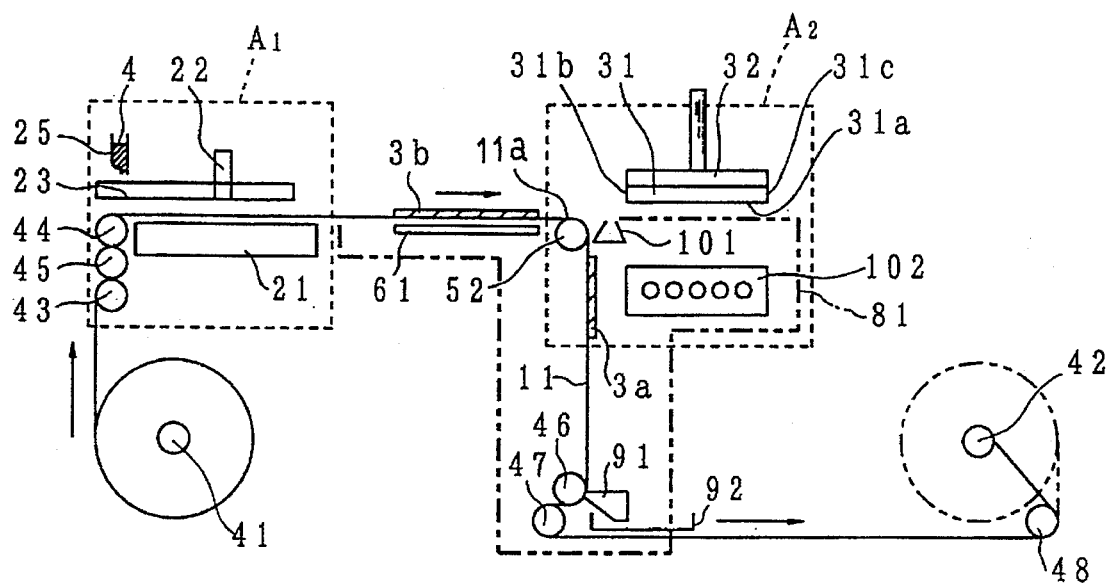
FIG. 9 is a schematic view representative of a step of positioning the first unexposed layer of the photohardenable composition within the layer exposing area.

Referring to FIGS. 8 and 9, the flexible sheet belt 11 is further moved from the layer forming area A1 toward the layer exposing area A2 by the predetermined distance, so that the first unexposed layer 3a of the photohardenable composition 4 on the flexible sheet belt 11 passes through the moving roller 52 in such a manner as to extend in a vertical direction as will be understood from FIG. 9.

Referring to FIG. 10, the moving support unit 81 is moved to assume the second unit position under the condition that the drive roller 45 is locked and that the tension between the drive roller 45 and the winding bobbin 42 is held at the constant level, and therefore the moving roller 52 and the positioning plate member 61 are moved to assume the second roller position and the second plate position, respectively. As a consequence, the position of the turned portion of the flexible sheet belt 11 formed by the moving roller 52 is progressively shifted from the one end 31b of the base plate member 31 toward the other end 31c of the base plate, member 31, so that the first unexposed layer 3a of the photohardenable composition 4 is laminated to the flat support surface 31a of the base plate member 31.

Figure 11:
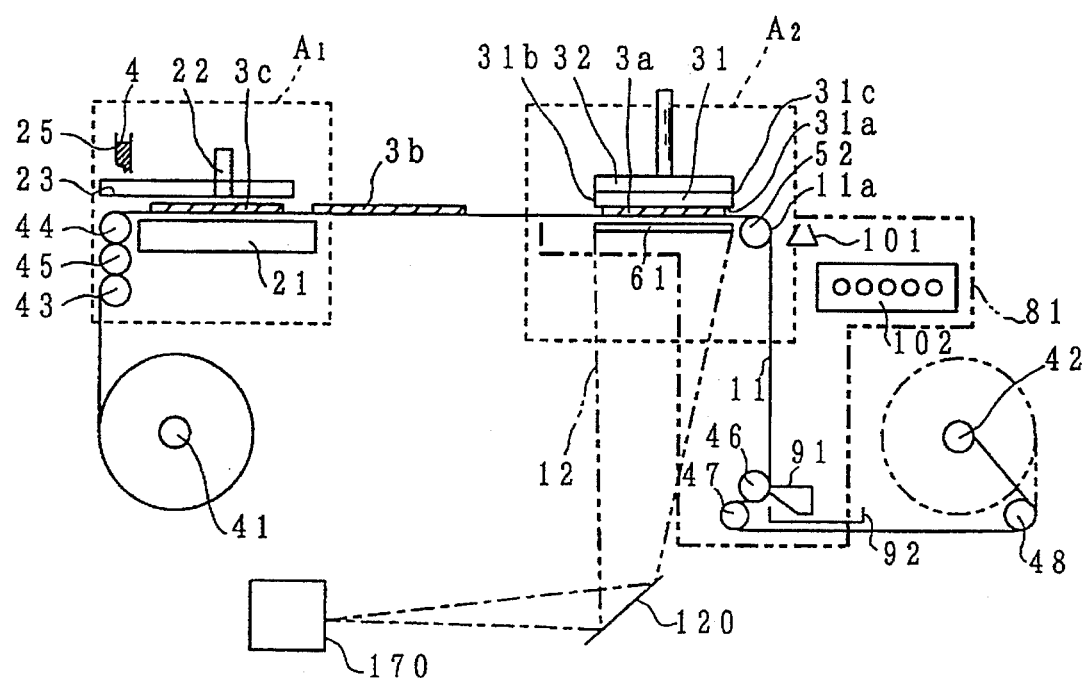
FIG. 11 is a schematic view representative of steps of exposing the first unexposed layer of the photohardenable composition to an actinic radiation to form a solid layer and an unhardened layer of the photohardenable composition, and forming a third unexposed layer of the photohardenable composition on the flexible sheet belt in the layer forming area.

Referring to FIG. 11, the positioning plate member 61 is moved in accordance with the movement of the moving support unit 81 to assume the second plate position, and therefore the positioning plate member 61 is positioned so as to face the base plate member 31 through the flexible sheet belt 11 in the layer-exposing area A2 and to be brought into contact with the flexible sheet belt 11, whereby the first unexposed layer 3a of the photohardenable composition 4 is supported and positioned by the positioning plate member 61 through the flexible sheet belt 11. At the same time, the first unexposed layer 3a of the photohardenable composition 4 is positioned with respect to the exposure means 170 by the base plate member 31 and the positioning plate member 61. When the radiation source 171 of the exposure means 170 is turned on, the actinic radiation 12 is radiated from the radiation source 171 and transmitted to the laminated first unexposed layer 3a of the photohardenable composition 4 by way of the condenser lens 173, the transmissive type liquid crystal light valve unit 172 having pixels operated by the EWS 110 in accordance with the configuration of the first solid layer 2, the image-formation lens unit 174, the heat absorbing optical element 120, the positioning plate member 61 and the flexible sheet belt 11, thereby to selectively expose the laminated first unexposed layer 3a of the photohardenable composition 4 to the actinic radiation 12 from the radiation source 171 to form a first solid layer 2a and a first unhardened layer 5a of the photohardenable composition 4 which are shown not in FIG. 11 but in FIGS. 12 and 13. At this time, the first solid layer 2a adheres to and is supported on the flat support surface 31a of the base plate member 31. During the exposure of the laminated first unexposed layer 3a of the photohardenable composition 4, the photohardenable composition 4 is fed from the composition feed device 25 to the layer forming means 20 and placed on the screen mesh 23. The air between the flat plate member 21 and the flexible sheet belt 11 is sucked by the suction pump through the suction bores of the flat plate member 21, thereby to cause the flexible sheet belt 11 to cling to the flat plate member 21. After the squeegee member 22, the screen mesh 23 and the tenter frame member 24 of the layer forming means 20 are moved by the elevator unit in the downward direction so as to be positioned with respect to the flat plate member 21, the squeegee member 22 is moved from one end of the screen mesh 23 toward the other end of the screen mesh 23 in a spaced-apart relationship to the flat plate member 21 at the constant. distance substantially equal to the thickness of the solid layer 2, thereby forcing the photohardenable composition 4 on the screen mesh 23 to pass through the screen mesh 23 to form a third unexposed layer 3c of the photohardenable composition 4 on the flexible sheet belt 11 clinging to the flat plate member 21. After the third unexposed layer 3c of the photohardenable composition 4 is formed on the flexible sheet belt 11, the flexible sheet belt 11 is free from the flat plate member 21 by stopping the suction of the air between the flat plate member 21 and the flexible sheet belt 11, and then the screen mesh 23 is moved by the elevator unit to return from the downward position to the upward position and accordingly the screen mesh 23 is spaced apart from the flat plate member 21 to the extent that the flexible sheet belt 11 is not brought into contact with screen mesh 23.

Figure 12:
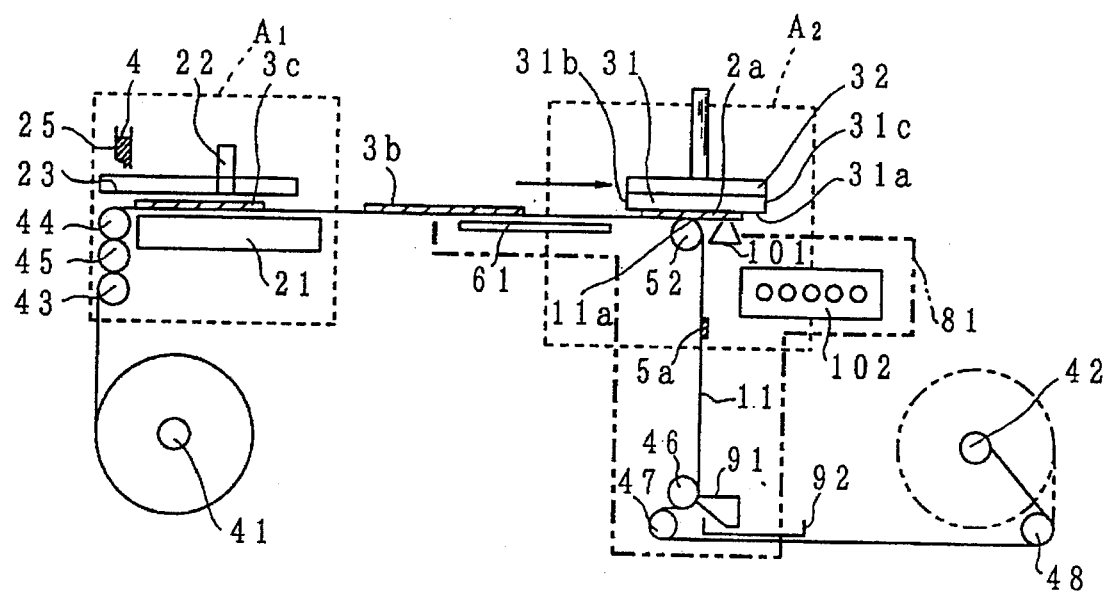
FIG. 12 is a schematic view representative of steps of separating the flexible sheet belt with the unhardened layer of the photohardenable composition from the solid layer in the layer exposing area, and removing, the unhardened layer of the photohardenable composition remaining in the solid layer.

Referring to FIG. 12, after the third unexposed layer 3c of the photohardenable composition 4 is formed on the flexible sheet belt 11 in the layer forming area A1, the moving support unit 81 is moved to return from the second unit position to the first unit position under the condition that the drive roller 45 is locked and that the tension of the flexible sheet belt 11 between the drive roller 45 and the winding bobbin 42 is held at the constant level, and as a consequence the moving roller 52 and the positioning plate member 61 are moved to return from the second roller position and the second plate position to the first roller position and the first plate position, respectively. The position of the turned portion of the flexible sheet belt 11, accordingly, is progressively shifted from the other end 31c of the base plate member 31 toward the one end 31b of the base plate member 31, so that the flexible sheet belt 11 with the first unhardened layer 5a of the photohardenable composition 4 is separated from the first solid layer 2a. If the first unhardened layer 5a of the photohardenable composition 4 remains in the first solid layer 2a, the first unhardened layer 5a of the photohardenable composition 4 is removed by the aspirator 101 from the first solid layer 2a while the moving support unit 81 is moved to return from the second unit position to the first unit position.

Referring to FIG. 13, the base plate member 31 is moved by the plate member support unit 32 in the upward direction by the thickness of the solid layer 2. The flexible sheet belt 11 is further unwounded from the feed bobbin 41 and moved from feed bobbin 41 toward the winding bobbin 42 by the predetermined distance and accordingly the second unexposed layer 3b of the photohardenable composition 4 passes through the moving roller 52 so as to extend on a vertical line. At the same time, the first unhardened layer 5a of the photohardenable composition 4 is scraped away by the blade member 91 of the retrieving means 90 from the flexible sheet belt 11, and then contained in the retrieve container 92. After the movement of the flexible sheet belt 11, the fourth unexposed layer (not shown) is formed on the flexible sheet belt 11 in the layer forming area A1. If, at this time, necessary, the first solid layer 2a can be re-exposed to the additional actinic radiation 130 by the postcuring means 102 in order to make sure of the solidification of the first solid layer 2a. During processes between the separation of the flexible sheet belt 11 from the first solid layer 2a and the retrieval of the first unhardened layer 5a of the photohardenable composition 4, the transmissive type liquid crystal light valve unit 172 is operated by the EWS 110 to have thereon a mask pattern corresponding to a second solid layer of the three-dimensional object 1.

Referring to FIG. 14, when the aforesaid processes shown in FIGS. 5 through 13 are repeated until the three-dimensional object 1 is formed by the solid layers 2, the base plate member 31 together with the three-dimensional object 1 is detached from the plate member support unit 32, and then an additional base plate member (not shown) is attached to the plate member support unit 32 in order to provide for the next fabrication of the three-dimensional object 1. Although there has been described in the above and shown in the drawings as to the fact that the position of the turned portion 11a of the flexible sheet belt 11 is moved from the other end 31c of the base plate member 31 toward the one end 31b of the base plate member 31 at the separating step, the flexible sheet belt 11 may have an additional turned portion in the vicinity of the one end 31b of the base plate member 31. In this case, the position of the additional turned portion is progressively shifted from the one end 31b of the base plate member 31 toward the other end 31c of the base plate member 31 so that the flexible sheet belt 11 is separated from the solid layer 2.

According to the fabricating method and apparatus described hereinbefore, the unexposed layer 3 of the photohardenable composition 4 is formed on the flexible sheet belt 11 in the layer forming area A1 different from the exposing area A2. Therefore, it is possible to readily and quickly form a highly accurate thickness of the unexposed layer 3 of the photohardenable composition 4 because of the fact that existence of the previously formed solid layer 2 is not required to be considered when the unexposed layer 3 of the photohardenable composition 4 is formed on the flexible sheet belt 11.

The formed unexposed layer 3 of the photohardenable composition 4 is conveyed from the layer forming area A1 to the layer exposing area A2 by moving the flexible sheet belt 11. In the exposing area A2, the flexible sheet belt 11 is brought into a close and parallel relationship to the flat support surface 31a of the base plate member 31, so that the unexposed layer 3 of the photohardenable composition 4 is laminated to the flat support surface 31a of the base plate member 31 facing downwardly, or the solid layer 2 previously formed on the flat support surface 31a of the base plate member 31 in the layer exposing area A2. This means that the unexposed layer 3 of the photohardenable composition 4 having a highly accurate thickness can be easily and quickly laminated to the flat support surface 31a of the base plate member 31 or the previously formed solid layer 2. Specifically, the moving roller 52 has the flexible sheet belt 11 formed with the turned portion 11a. The position of the turned portion 11a of the flexible sheet belt 11 is progressively shifted from one end 31b of the base plate member 31 to the other end 31c of the base plate member 31 by moving the moving roller 52 from the one end 31b of the base plate member 31 to the other end 31c of the base plate member 31. In this case, the unexposed layer 3 of the photohardenable composition 4 progressively adheres to the flat support surface 31a of the base plate member 31 or the previously formed solid layer 2 from end to end, thereby making it possible to prevent air from being captured between the unexposed layer 3 of the photohardenable composition 4 and the flat support surface 31a of the base plate member 31 or the previously formed solid layer 2.

The laminated unexposed layer 3 of the photohardenable composition 4 is supported and positioned with respect to the exposure means 170 by the positioning plate member 61. That is, the unexposed layer 3 of the photohardenable composition 4 having fluidity can be certainly supported and positioned before the exposure. Since the flexible sheet belt 11 and the positioning plate member 61 are transmissive to the actinic radiation 11, the laminated unexposed layer 3 of the photohardenable composition 4 can be selectively exposed to the actinic radiation 12 through the positioning plate member 61 and the flexible sheet belt 11 to form the solid layer 2. The unexposed layer 3 of the photohardenable composition 4, therefore, is certainly supported and positioned during the exposure, thereby making is possible to render the formed solid layer 2 highly accurate.

The flexible sheet belt 11 can be easily separated from the solid layer 2 after the positioning plate member 61 is removed from the flexible sheet belt 11. The reason is that flexible sheet belt 11 is more flexible than the solid layer 2. Specifically, the position of the turned portion 11a of the flexible sheet belt 11 is progressively shifted from the other end 31c of the base plate member 31 to the one end 31b of the base plate member 31 by moving the moving roller 52 from the other end 31c of the base plate member 31 to the one end 31b of the base plate member 31. In this case, the flexible sheet belt 11 is separated from the solid layer 2 in order, so that the solid layer 2 can be prevented from being damaged and distorted.

In addition, the unhardened layer 5 of the photohardenable composition 4 with the flexible sheet belt 11 can be easily separated from the solid layer 2 because of the fact that adhesion between the solid layer 2 and unhardened layer 5 is smaller than that between the flexible sheet belt 11 and the unhardened layer 5. If the unhardened layer 5 of the photohardenable composition 4 remains in the solid layer 2, the unhardened layer 5 of the photohardenable composition 4 can be removed by the aspirator 101 from the solid layer 2. This results in the fact there is no unhardened layer remaining in the exposing area A2, and as a result it is unnecessary to control power of the actinic radiation, for example, to restrict the power of the actinic radiation to a level corresponding to the thickness of the laminated unexposed layer 3 of the photohardenable composition 4. Therefore, not only the radiation source 171 of the exposure means 170 can be constituted by a low-priced light source, but also the unexposed layer 3 of the photohardenable composition 4 can be rapidly and uniformly exposed to powerful actinic radiation to the extent that postcuring is unnecessary. Additionally, since the there is no unhardened layer of the photohardenable composition 4 remaining in the fabricated three-dimensional object 1, it is unnecessary to remove the unhardened layer 5 of the photohardenable composition 4 after the three-dimensional object 1 is fabricated. Furthermore, if one of the solid layers forming the three-dimensional object has a overhang portion, it is necessary to support the overhang portion of the solid layer during the fabricating process. The. reason is that the unexposed layer 3 of the photohardenable composition 4 is sufficiently exposed to powerful actinic radiation to the extent that the postcuring is unnecessary as set forth above.

The photohardenable composition 4 has a viscosity of 10,000 to 100,000 cP, so that the thickness of the unexposed layer 3 of the photohardenable composition 4 on the flexible sheet belt 11 can be held at a constant level during the fabricating process. In addition, the photohardenable composition 4 includes the photohardenable resin and the solid particles transmissive to the actinic radiation 12. The solid particles are present in 40 to 75% by volume based on the total volume of the photohardenable composition 4. For this reason, the unexposed layer 3 of the photohardenable composition 4 can be prevented from being contracted by the exposure in comparison with a photohardenable composition including no solid particle, and accordingly the solid layer 2 can be prevented from being distorted.

The amount of the extremely expensive photohardenable resin used for one three-dimensional object can be reduced, since the photohardenable composition 4 including not only the photohardenable resin but also the solid particles as above-mentioned. In addition, the expensive photohardenable composition 4 is retrieved by the retrieving means 90 from the flexible sheet belt 11 so as to be recycled. Therefore, the fabricated three-dimensional object 1 can be low-priced.

After the unhardened layer 5 of the photohardenable composition 4 is removed from the flexible sheet belt 11, the flexible sheet belt 11 is wound on the winding bobbin 42. Accordingly, the flexible sheet belt 11 wound on the winding bobbin 42 can be recycled by merely exchanging the feed bobbin 41 for the winding bobbin 42 after all the flexible sheet belt 11 is wound on the winding bobbin 42.

Figure 15:
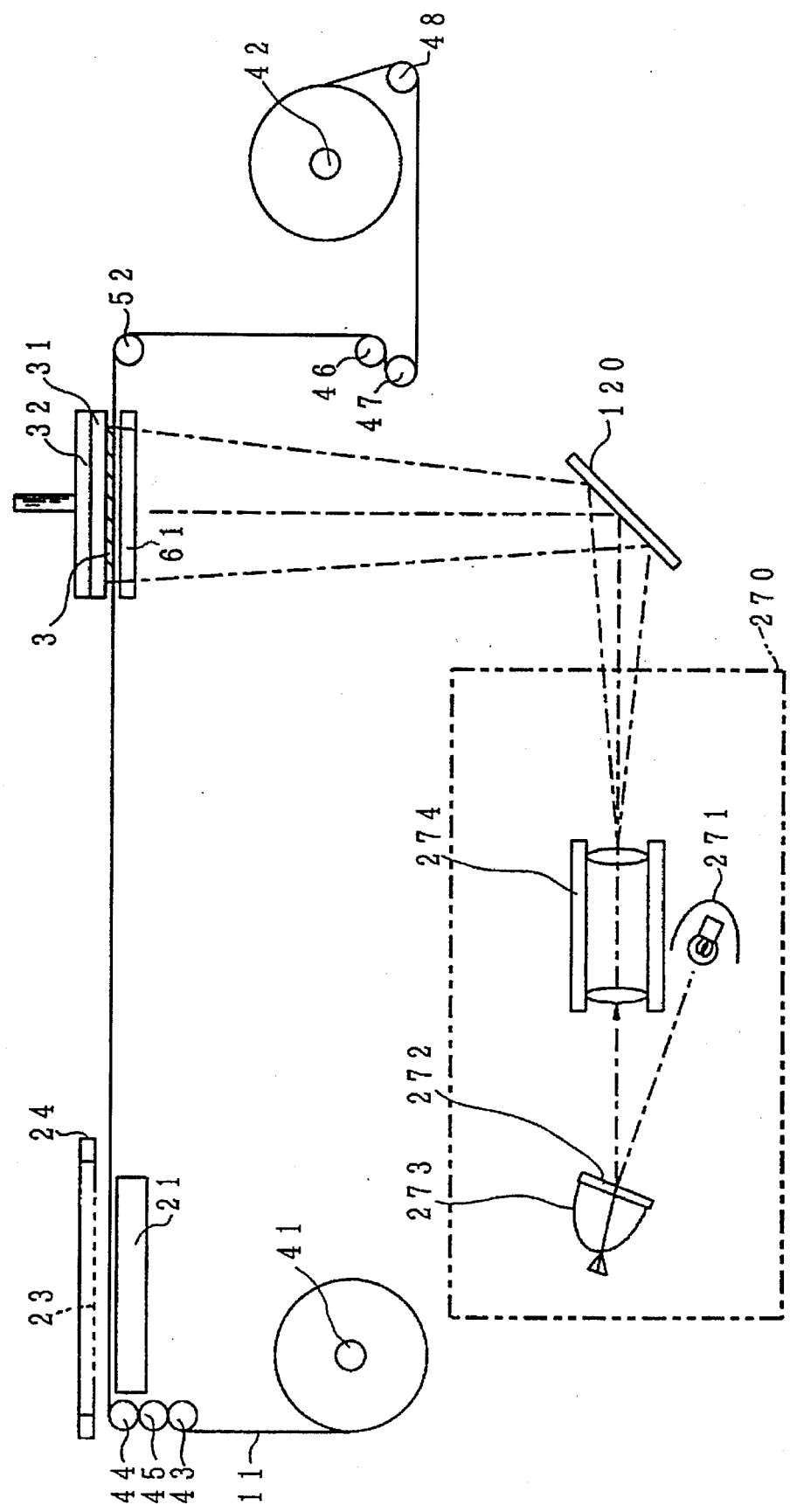
FIG. 15 is a schematic view showing a second embodiment of a fabricating apparatus according to the present invention.

FIG. 15 shows a second embodiment of the fabricating apparatus according to the present invention. The fabricating apparatus in the second embodiment comprises exposure means 270 and is constructed in a similar manner to that in the aforesaid first embodiment except for the difference between the exposure means 170 of the first embodiment and the exposure means 270. For this reason, the following description will be merely and briefly made regarding the exposure means 270.

The exposure means 270 is shown in FIG. 15 as comprising a radiation source 271 such as an ultraviolet ray lamp or a visible light lamp for radiating the actinic radiation 12, and a reflection type liquid crystal light valve unit 272 provided between the radiation source 271 and the laminated unexposed layer 3 of the photohardenable composition 4 for having the actinic radiation 12 selectively reflected and transmitted to the laminated unexposed layer 3 of the photohardenable composition 4. The exposure means 270 further comprises a CRT (Cathode Ray Tube) 273 for emitting electron beam based on the shape of the solid layer 2 and irradiating the reflection type liquid crystal light valve unit 272 with the produced electron beam to form a reflection pattern on the reflection type liquid crystal light valve unit 272, and an image-formation lens unit 274 provided between the reflection type liquid crystal light valve unit 272 and the laminated unexposed layer 3 of the photohardenable composition 4. The reflection type liquid crystal light valve unit 272 is designed to allow the actinic radiation 12 to be selectively reflected thereon in accordance with the reflection pattern formed by the electron beam from the CRT 273. In the exposure means 270 thus constructed, the reflection pattern of the reflection type liquid crystal light valve unit 272 can be rewritten rapidly. If desired, the foregoing reflection type liquid crystal light valve unit 272 is adapted to form thereon a reflection pattern based on an infrared laser beam emitted from laser unit (not shown). In this instance, it is unnecessary to continue to irradiate the reflection type liquid crystal light valve unit 272 with the infrared laser beam during the exposure.

Figure 16:
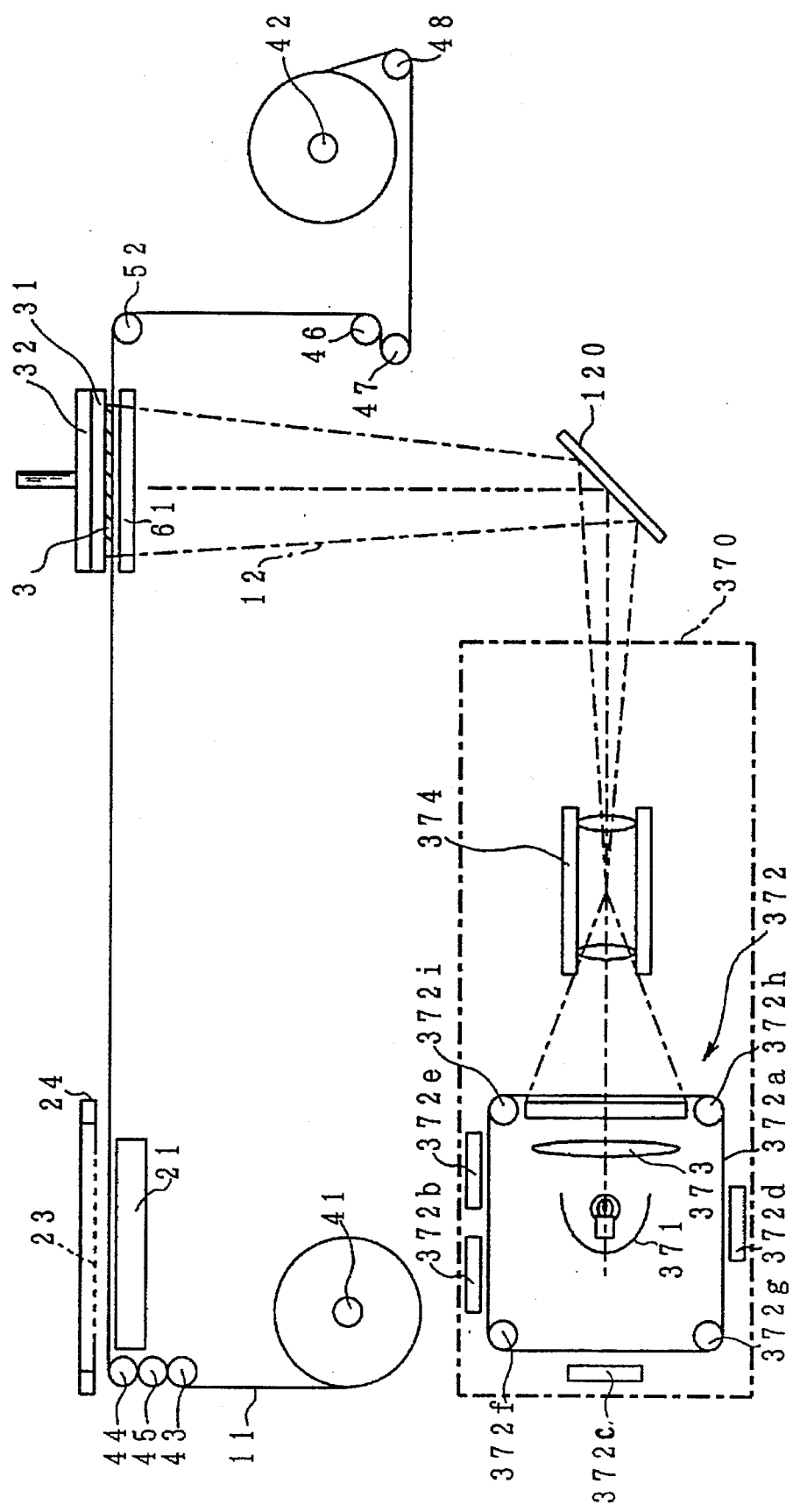
FIG. 16 is a schematic view showing a third embodiment of a fabricating apparatus according to the present invention.

FIG. 16 shows a third embodiment of the fabricating apparatus according to the present invention. The fabricating apparatus in the third embodiment comprises exposure means 370 and is constructed in a similar manner to that in the aforesaid first embodiment except for the difference between the exposure means 170 of the first embodiment and the exposure means 370. For this reason, the following description will be merely and briefly made regarding the exposure means 370.

The exposure means 370 is shown in FIG. 16 as comprising a radiation source 371 such as an ultraviolet ray lamp for radiating the actinic radiation, an electrophotographic unit 372 provided between the radiation source 371 and the laminated unexposed layer 3 of the photohardenable composition 4, a condenser lens 373 provided between the radiation source 371 and the electrophotographic unit 372, and an image-formation lens unit 374 provided between the electrophotographic unit 372 and the laminated unexposed layer 3 of the photohardenable composition 4. The electrophotographic unit 372 includes a moving endless belt 372a having a photo-conductive layer supported thereon, the moving endless belt 372a and photo-conductive layer being transmissive to the actinic radiation, an electrifying device 372b for electrifying the photoconductive layer on the moving endless belt 372a, an exposure device 372c for selectively exposing the photo-conductive layer electrified by the electrifying device 372b, and a developing device 372d for feeding toner to the photo-conductive layer selectively exposed by the exposure device 372c to develop the exposed photoconductive layer, a removing device 372e for removing the toner and the electric charge from the photoconductive layer, and a drive roller 372f and movable rollers 372g, 372h and 372i for rotating the moving endless belt 372a in such a manner that the photo-conductive layer on the moving endless belt 372a is operated by the electrifying device 372b, the exposure device 372c, the developing device 372d, and the removing device 372e in order of mention. The actinic radiation 122 from the radiation source 371 is allowed to selectively pass through and to be transmitted to the laminated unexposed layer 3 through the photo-conductive layer on the moving endless belt 372a developed by the developing device 372d. In this case, a mask pattern corresponding to the solid layer is defined by the toner adhering to the moving endless belt 372a. If solid layers identical with one another is successively formed, it goes without saying that the mask pattern defined by the toner is repeatedly utilized. The toner can be readily removed and retrieved from the moving endless belt 372a so as to be recycled since the electrophotographic unit 372 is not required to comprise fixing means for fixing the mask pattern defined by the toner.

Figure 17:
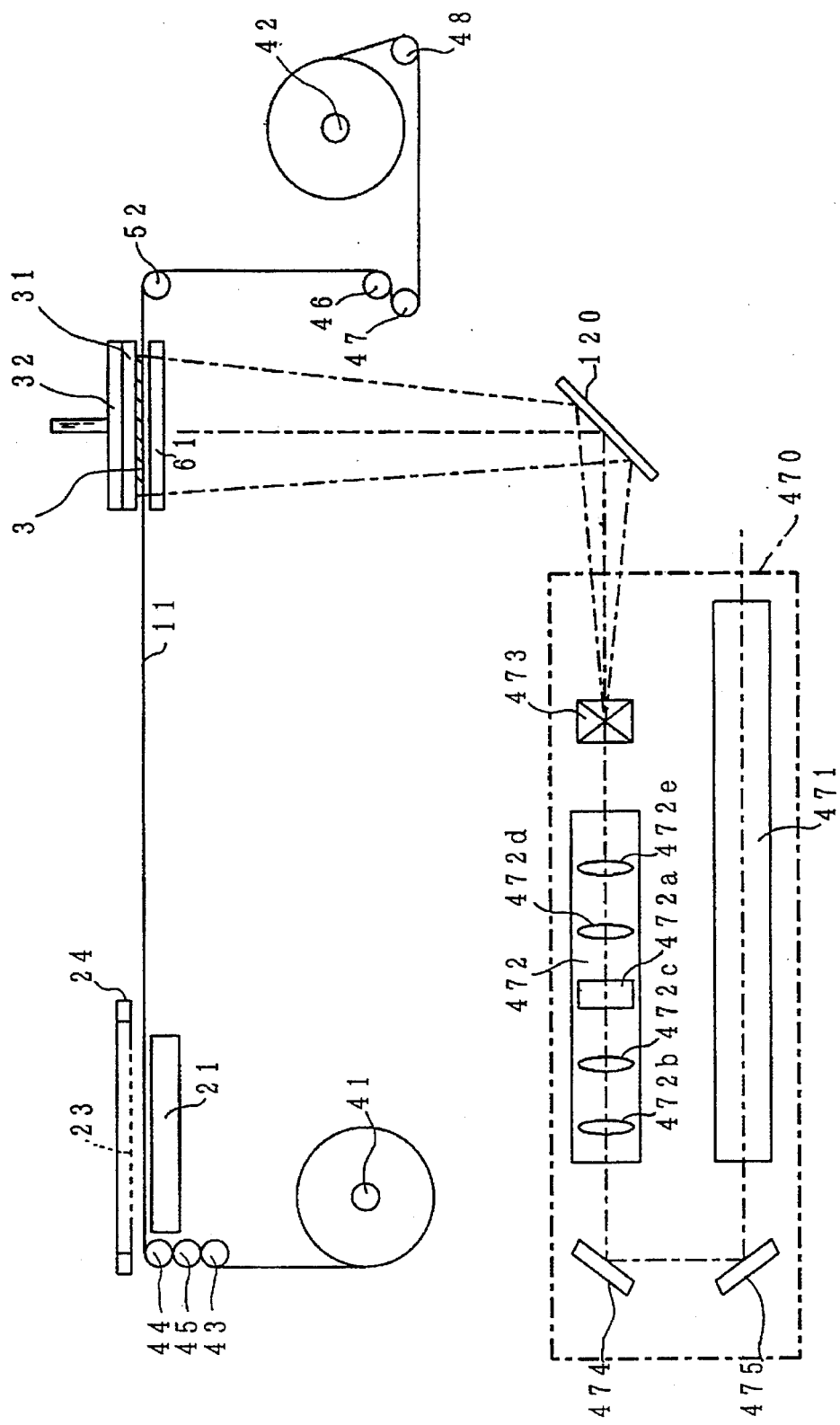
FIG. 17 is a schematic view showing a fourth embodiment of a fabricating apparatus according to the present invention.
Figure 18:
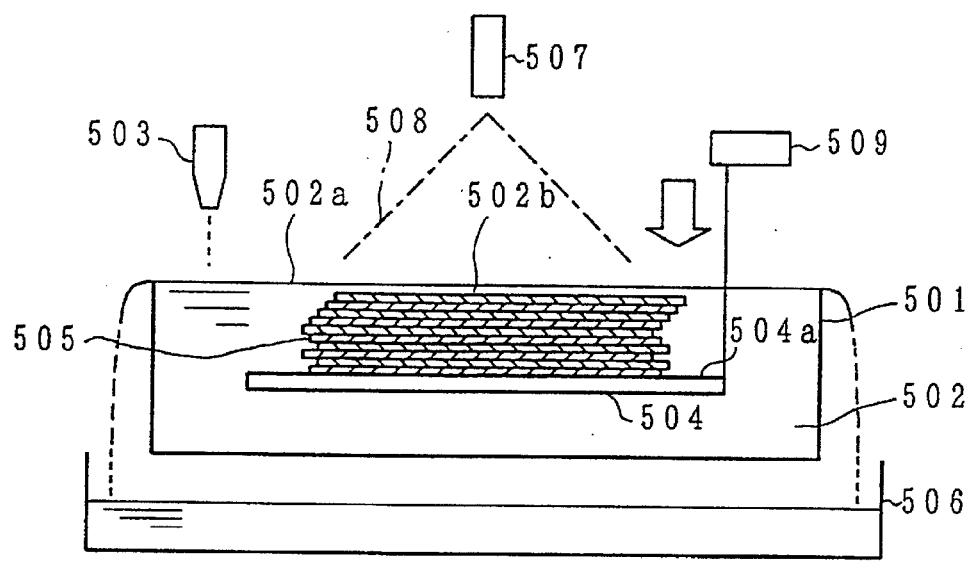
FIG. 18 is a schematic view of a prior-art apparatus for fabricating a three-dimensional object.
Figure 19:
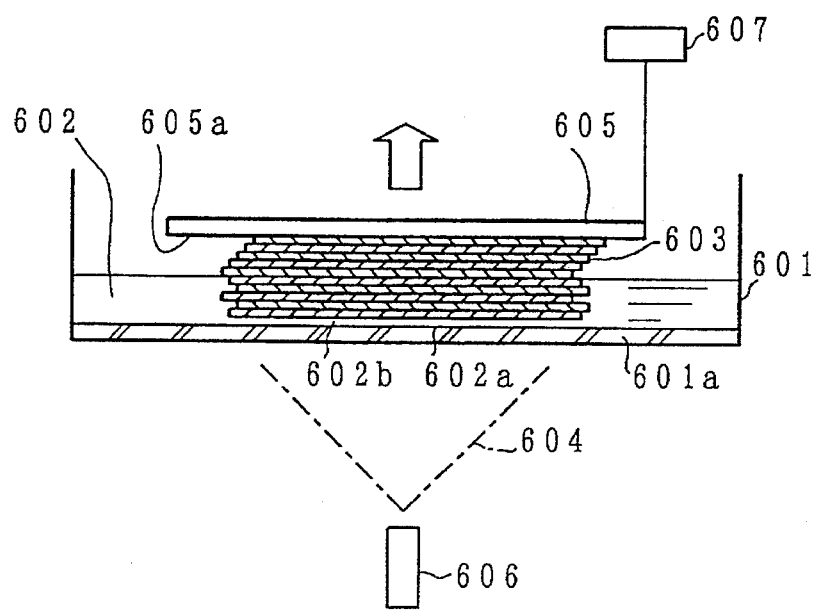
FIG. 19 is a schematic view of another prior-art apparatus for fabricating a three.-dimensional object.

FIG. 17 shows a fourth embodiment of the fabricating apparatus according to the present invention. The fabricating apparatus in the fourth embodiment comprises exposure means 470 and is constructed in a similar manner to that in the aforesaid first embodiment except for the difference between the exposure means 170 of the first embodiment and the exposure means 470. For this reason, the following description will be merely and briefly made regarding the exposure means 470.

The exposure means 470 is shown in FIG. 17 as comprising a laser unit 471 such as an ultraviolet laser unit for radiating ultraviolet laser beam forming the actinic radiation 12, an optical unit 472 provided between the laser unit 471 and the laminated unexposed layer 3 of the photohardenable composition 4 for intermittently allowing the laser beam to pass through the optical unit 472, a scanning unit 473 provided between the optical unit 472 and the laminated unexposed layer 3 of the photohardenable composition 4 for causing the laser beam to scan the laminated unexposed layer 3 of the photohardenable composition 4, and reflectors 474 and 475. In the exposing means 470 thus constructed and shown in FIG. 17, the solid layer can be contrasted with the unhardened layer, i.e., the boundary between the solid layer and the unhardened layer can be clear, thereby making it possible to provide a highly accurate three-dimensional object.

It will be understood by those skilled in the art that the foregoing description is in terms of the preferred embodiments of the present invention wherein various changes and modifications may be made without departing from the spirit and scope of the invention, as Set forth in the appended claims.

What is claimed is:

1. A method of fabricating a three-dimensional object which is constituted by successive solid layers each formed by selectively exposing an unexposed layer of a photohardenable composition to actinic radiation in a layer exposing area the unexposed layer of said photohardenable composition being formed in a layer forming area and then conveyed to said layer exposing area and said method comprising the steps of:

a. preparing a flexible sheet belt transmissive to said actinic radiation a base plate member having a flat support surface facing downwardly, and a positioning plate member transmissive to said actinic radiation;

b. forming the unexposed layer of said photohardenable composition on said flexible sheet belt in said layer forming area;

c. moving said flexible sheet belt from said layer forming area toward said layer exposing area to convey the unexposed layer of said photohardenable composition on said flexible sheet belt from said layer forming area to said layer exposing area;

d. bringing said flexible sheet belt into a close and parallel relationship with said flat support surface of said base plate member to laminate the unexposed layer of said photohardenable composition to said flat support surface of said base plate member or the solid layer previously formed;

e. positioning said positioning plate member in such a manner that said positioning plate member faces said base plate member through said flexible sheet belt and is brought into contact with said flexible sheet belt, so that the unexposed layer of said photohardenable composition is supported and positioned by said positioning plate member through said flexible sheet belt;

f. selectively exposing the unexposed layer of said photohardenable composition to said actinic radiation through said positioning plate member and said flexible sheet belt to form a new solid layer and an unhardened layer of said photohardenable composition;

g. removing said positioning plate member from said flexible sheet belt;

h. separating said flexible sheet belt with the unhardened layer of said photohardenable composition from the newly formed solid layer by progressively shifting the position of the turned portion of said flexible sheet belt from said the other end of said base plate member toward said one end of said base plate member, so that said flexible sheet belt with the unhardened layer of said photohardenable composition is separated from the newly formed solid layer;

i. repeating said steps (b) to (h) until the three-dimensional object is formed by the solid layers;

j. wherein said step of bringing said flexible sheet belt into relationship with said flat support surface to laminate the unexposed layer further comprises:

(1) partly turning said flexible sheet belt in the vicinity of one end of said base plate member to have said flexible sheet belt formed with a turned portion; and (2) progressively shifting position of the turned portion of said flexible sheet belt from said one end of said base plate member toward the other end of said base plate member, so that the unexposed layer of said photohardenable composition is laminated to said flat support surface of said base plate member or the solid layer previously formed;

(3) and wherein said step of separating said flexible sheet belt with the unhardened layer of said photohardenable composition from the newly formed solid layer comprises:

(4) progressively shifting the position of the turned portion of said flexible sheet belt from said other end of said base plate member toward said one end of said base plate member, so that said flexible sheet belt with the unhardened layer of said photohardenable composition is separated from the newly formed solid layer.

2. A method of fabricating a three-dimensional object constituted of successive solid layers each formed by selectively exposing an unexposed layer of a photohardenable composition to actinic radiation in a layer exposing area, the unexposed layer of said photohardenable composition being formed in a layer forming area and then conveyed to said layer exposing area, comprising the steps of:

a. providing a flexible sheet belt transmissive to said actinic radiation, a base plate member having a flat support surface facing downwardly, a positioning plate member transmissive to said actinic radiation, and a moving roller rotatable about its own axis;

b. forming the unexposed layer of said photohardenable composition on said flexible sheet belt in said layer forming area;

c. moving said flexible sheet belt from said layer forming area toward said layer exposing area to convey the unexposed layer of said photohardenable composition on said flexible sheet belt from said layer forming area to said layer exposing area;

d. bringing said flexible sheet belt into close parallel relationship with said flat support surface of said base plate member to laminate the unexposed layer of said photohardenable composition to said flat support surface of said base plate member or the solid layer previously formed;

e. positioning said positioning plate member in such a manner that said positioning plate member faces said base plate member through said flexible sheet belt and is brought into contact with said flexible sheet belt, so that the unexposed layer of said photohardenable composition is supported and positioned by said positioning plate member through said flexible sheet belt;

f. selectively exposing the unexposed layer of said photohardenable composition to said actinic radiation through said positioning plate member and said flexible sheet belt to form a new solid layer and an unhardened layer of said photohardenable composition;

g. removing said positioning plate member from said flexible sheet belt;

h. separating said flexible sheet belt with the unhardened layer of said photohardenable composition from the newly formed solid layer; and i. repeating said steps (b) to (h) until three-dimensional object is formed by the solid layers, wherein said step (d) comprises:

d1 partly turning said flexible sheet belt in the vicinity of one end of said base plate member to have said flexible sheet belt formed with a turned portion; and d2 progressively shifting position of the turned portion of said flexible sheet belt from said one end of said base plate member toward the other end of said base plate member by rotatably moving said moving roller from one end of said base plate member toward the other end of said base plate member under and in a parallel relationship to said flat support surface of said base plate member, so that the unexposed layer of said photohardenable composition is laminated to said flat support surface of said base plate member or the solid layer previously formed;

j. and wherein said separating step (h) comprises:

h1 progressively shifting the position of the turned portion of said flexible sheet belt from said the other end of said base plate member toward said one end of said base plate member by rotatably moving said moving roller from the other end of said base plate member toward said one end of said base plate member under and in a parallel relationship to said flat support surface of said base plate member, so that said flexible sheet belt with the unhardened layer of said photohardenable composition is separated from the newly formed solid layer.

3. An apparatus for fabricating a three-dimensional object which is constituted by successive solid layers each formed by selectively exposing an unexposed layer of a photohardenable composition to actinic radiation in a layer exposing area, the unexposed layer of said photohardenable composition being formed in a layer forming area and then conveyed to said layer exposing area, and said apparatus comprising:

a flexible sheet belt transmissive to said actinic radiation;

layer forming means for forming the unexposed layer of said photohardenable composition on said flexible sheet belt in said layer forming area;

a base plate member placed in said layer exposing area and having a flat support surface facing downwardly to have the solid layers formed thereon;

moving means for moving said flexible sheet belt from said layer forming area toward layer exposing area to convey the unexposed layer of said photohardenable composition formed on said flexible sheet belt from said layer forming area to said layer exposing area;

layer laminating means for bringing flexible sheet belt into a close and parallel relationship to said flat support surface of said base plate member to laminate the unexposed layer of said photohardenable composition to the solid layer previously formed on said flat support surface of said base slate member;

a positioning plate member transmissive to said actinic radiation and movable with respect to said base plate member to assume two different positions consisting of a first plate position in which the unexposed layer of said photohardenable composition is allowed to be laminated by said layer laminating means to the solid layer previously formed on said flat support surface of said base plate member, and a second plate position in which said positioning plate member is positioned so as to face said base plate member through said flexible sheet belt and to be brought into contact with said flexible sheet belt, so that the unexposed layer of said photohardenable composition is supported and positioned by said positioning plate member through said flexible sheet belt;

exposure means for selectively exposing the unexposed layer of said photohardenable composition to said actinic radiation through said positioning plate member and said flexible sheet belt to form a new solid layer and an unhardened layer of said photohardenable composition;

plate member moving means for moving said positioning plate member to cause said positioning plate member to assume said first plate position before the unexposed layer of said photohardenable composition is laminated by said layer laminating means to the solid layer previously formed on said flat support surface of said base plate member for further moving said positioning plate member to cause said positioning plate member to assume said second plate position after the unexposed layer of said photohardenable composition is laminated by said layer laminating means to the solid layer previously formed on said flat support surface of said base plate member, before the unexposed layer of said photohardenable composition is selectively exposed by said exposure means to actinic radiation, and for further moving said positioning plate member so as to return from said second plate position to said first plate position after the unexposed layer of said photohardenable composition is selectively exposed by said exposure means to said actinic radiation; and separating means for separating said flexible sheet belt with the unhardened layer of said photohardenable composition from the solid layer after said positioning plate member is moved by said plate member moving means so as to return from said second plate position to said first plate position.

4. An apparatus for fabricating a three-dimensional object as set forth in claim 3, wherein said layer laminating means and said separating means comprise a common moving roller rotatable about its own axis and movable with respect to and in a parallel relationship to said base plate member to assume two different positions consisting of a first roller position in which the unexposed layer of said photohardenable composition is allowed to be conveyed by said moving means from said layer forming area to said layer exposing area, and a second roller position in which the unexposed layer of said photohardenable composition is allowed to be exposed by said exposure means to said actinic radiation through said positioning plate member and said flexible sheet belt, said flexible sheet belt being partly turned by said moving roller in the vicinity of one end of said base plate member to have said flexible sheet belt formed with a turned portion when said moving roller is moved to assume said first roller position, the position of the turned portion of said flexible sheet belt being progressively shifted from said one end of said base plate member toward the other end of said base plate member by rotatably moving said moving roller from said first roller position to said second roller position, so that the unexposed layer of said photohardenable composition is laminated to said flat support surface of said base plate member or the solid layer previously formed, and the position of the turned portion of said flexible sheet belt being progressively shifted from said other end of said base plate member toward said one end of said base plate member by rotatably moving said moving roller from said second roller position to said first roller position, so that said flexible sheet belt with the unhardened layer of said photohardenable composition is separated from the newly formed solid layer.

5. An apparatus for fabricating a three-dimensional object as set forth in claim 4, wherein said plate member moving means comprises a moving support unit securely supporting said positioning plate member in such a manner that said flexible sheet belt is provided between said positioning plate member and said base plate member, said moving support unit further rotatably supporting said moving roller in such a manner that said moving roller adjoins said positioning plate member, said moving support unit being movable with respect to said base plate member to assume two different positions consisting of a first unit position in which said positioning plate member and said moving roller assume said first plate position and said first roller position, respectively, and a second unit position in which said positioning plate member and said moving roller assume said second plate position and said second roller position, respectively.

6. An apparatus for fabricating a three-dimensional object as set forth in claim 3, further comprising a base plate member support unit detachably supporting said base plate member and moving with respect to said exposure means in such a manner that said base plate member is moved in an upward direction perpendicular to said flat support surface of said base plate member by a distance substantially equal to the thickness of the solid layer each time the solid layer is formed.

7. An apparatus for fabricating a three-dimensional object as set forth in claim 3, wherein said photohardenable composition has a viscosity of 10,000 to 100,000 cP.

8. An apparatus for fabricating a three-dimensional object as set forth in claim 3, wherein said photohardenable composition includes a photohardenable resin and a plurality of solid particles.

9. An apparatus for fabricating a three-dimensional object as set forth in claim 8, wherein said solid particles are transmissive to said actinic radiation.

10. An apparatus for fabricating a three-dimensional object as set forth in claim 8, wherein said solid particles are present in 40 to 75% by volume based on the total volume of said photohardenable composition.

11. An apparatus for fabricating a three-dimensional object as set forth in claim 3, wherein said layer forming means comprises:

aflat plate member for having said flexible sheet belt clinging thereto when the unexposed layer of said photohardenable composition is formed on said flexible sheet belt;

a squeegee member movable over and with respect to saidflat plate member in a spaced-apart relationship with said flexible sheet belt on said flat plate member at a constant distance substantially equal to the thickness of the unexposed layer of said photohardenable composition, a screen mesh disposed between said flexible sheet belt and said squeegee member in a face-to-face and spaced-apart relationship to said flexible sheet belt on saidflat plate member and having said photohardenable composition placed thereon, said photohardenable composition placed on said screen mesh being permitted to pass through said screen mesh to form the unexposed layer of said photohardenable composition when said squeegee member is moved with respect to said screen mesh.

12. An apparatus for fabricating a three-dimensional object as set forth in claim 11, wherein saidflat plate member is formed with a plurality of suction bores which suck air between saidflat plate member and said flexible sheet belt to cause said flexible sheet belt to cling to saidflat plate member when the unexposed layer of said photohardenable composition is formed on said flexible sheet belt.

13. An apparatus for fabricating a three-dimensional object as set forth in claim 3, further comprising retrieving means for retrieving the unhardened layer of said photohardenable composition from said flexible sheet belt to recycle the unhardened layer of said photohardenable composition.

14. An apparatus for fabricating a three-dimensional object as set forth in claim 13, wherein said retrieving means comprises:

a blade member for scraping away the unhardened layer of said photohardenable composition from said flexible sheet belt; and a retrieve container for containing the unhardened layer of said photohardenable composition removed by said blade member from said flexible sheet belt.

15. An apparatus for fabricating a three-dimensional object as set forth in claim 13, wherein said moving means comprises:

a feed bobbin for previously having said flexible sheet belt wound thereon to feed said flexible sheet belt to said layer forming means; and a winding bobbin for having said flexible sheet belt wound thereon after the unhardened layer of said photohardenable composition is retrieved by retrieving means from said flexible sheet belt.

16. An apparatus for fabricating a three-dimensional object as set forth in claim 3, wherein said exposure means comprises:

a radiation source for radiating said actinic radiation;

a transmission type liquid crystal light valve unit provided between said radiation source and the laminated unexposed layer of said photohardenable composition for causing said actinic radiation to selectively pass therethrough and to be transmitted to the laminated unexposed layer of said photohardenable composition.

17. An apparatus for fabricating a three-dimensional object as set forth in claim 16, further comprising a heat absorbing optical element provided between said radiation source of said exposure means and the laminated unexposed layer of said photohardenable composition for eliminating infrared radiation included in said actinic radiation from said radiation source of said exposure means.

18. An apparatus for fabricating a three-dimensional object as set forth in claim 3, wherein said exposure means comprises:

a radiation source for radiating said actinic radiation;

a reflection type liquid crystal light valve unit provided between said radiation source and the laminated unexposed layer of said photohardenable composition for having said actinic radiation selectively reflected and transmitted to the laminated unexposed layer of said photohardenable composition.

19. An apparatus for fabricating a three-dimensional object as set forth in claim 18, further comprising a heat absorbing optical element provided between said radiation source of said exposure means and the laminated unexposed layer of said photohardenable composition for eliminating infrared radiation included in said actinic radiation from said radiation source of said exposure means.

20. An apparatus for fabricating a three-dimensional object as set forth in claim 3, wherein said exposure means comprises:

a radiation source for radiating said actinic radiation;

an electrophotographic unit including a moving endless belt having a photo-conductive layer supported thereon, said moving endless belt and photo-conductive layer being transmissive to said actinic radiation, an electrifying device for electrifying said photoconductive layer on said moving endless belt, an exposure device for selectively exposing said photo-conductive layer electrified by said electrifying device, and a developing device for feeding toner to said photo-conductive layer selectively exposed by said exposure device to develop the exposed photo-conductive layer on said moving endless belt, a removing device for removing said toner from said photo-conductive layer on the moving endless belt, and a plurality of rotation rollers for rotating said moving endless belt in such a manner that said photo-conductive layer on said moving endless belt is operated by said electrifying device, said exposure device, said developing device, and a removing device in order of mention, said actinic radiation from said radiation source being allowed to selectively pass through and to be transmitted to the laminated unexposed layer through said moving endless belt and said photoconductive layer on said moving endless belt developed by said developing device.

21. An apparatus for fabricating a three-dimensional object as set forth in claim 20, further comprising a heat absorbing optical element provided between said radiation source of said exposure means and the laminated unexposed layer of said photohardenable composition for eliminating infrared radiation included in said actinic radiation from said radiation source of said exposure means.

22. An apparatus for fabricating a three-dimensional object as set forth in claim 3, wherein said exposure means comprises:

a laser unit for radiating a laser beam forming said actinic radiation;

an optical unit provided between said radiation source and the laminated unexposed layer of said photohardenable composition for intermittently allowing said laser beam to pass therethrough; and a scanning unit provided between said optical unit and the laminated unexposed layer of said photohardenable composition for causing said laser beam to scan the laminated unexposed layer of said photohardenable composition.

23. An apparatus for fabricating a three-dimensional object as set forth in claim 22, further comprising a heat absorbing optical element provided between said radiation source of said exposure means and the laminated unexposed layer of said photohardenable composition for eliminating infrared radiation included in said laser beam from said radiation source of said exposure means.

* * * * *